(12) United States Patent
Bao et al.

(10) Patent No.: US 8,847,391 B2
(45) Date of Patent: Sep. 30, 2014

(54) NON-CIRCULAR UNDER BUMP METALLIZATION (UBM) STRUCTURE, ORIENTATION OF NON-CIRCULAR UBM STRUCTURE AND TRACE ORIENTATION TO INHIBIT PEELING AND/OR CRACKING

(71) Applicant: QUALCOMM Incorporated, San Diego, CA (US)

(72) Inventors: Zhongping Bao, San Diego, CA (US); Lily Zhao, San Diego, CA (US); Michael Kim-Kwong Han, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/777,271

(22) Filed: Feb. 26, 2013

(65) Prior Publication Data

US 2014/0008788 A1    Jan. 9, 2014

Related U.S. Application Data

(60) Provisional application No. 61/669,334, filed on Jul. 9, 2012.

(51) Int. Cl.
*H01L 23/48* (2006.01)
*H01L 23/52* (2006.01)
*H01L 29/40* (2006.01)
*H01L 23/00* (2006.01)
*H01L 23/498* (2006.01)

(52) U.S. Cl.
CPC ....... *H01L 24/14* (2013.01); *H01L 2224/81815* (2013.01); *H01L 2224/13082* (2013.01); *H01L 2224/06131* (2013.01); *H01L 2224/13027* (2013.01); *H01L 2924/3512* (2013.01); *H01L 23/49811* (2013.01); *H01L 2224/06051* (2013.01); *H01L 2224/13015* (2013.01); *H01L 2224/13012* (2013.01); *H01L 2224/05541* (2013.01); *H01L 24/11* (2013.01); *H01L 24/16* (2013.01); *H01L 2224/05552* (2013.01); *H01L 24/03* (2013.01); *H01L 23/49838* (2013.01); *H01L 2224/06133* (2013.01); *H01L 2224/81203* (2013.01); *H01L 2224/05572* (2013.01); *H01L 2224/81191* (2013.01); *H01L 24/06* (2013.01); *H01L 2224/06145* (2013.01); *H01L 2224/06517* (2013.01); *H01L 2224/811* (2013.01); *H01L 2224/13006* (2013.01); *H01L 2224/13022* (2013.01); *H01L 24/13* (2013.01); *H01L 2224/06141* (2013.01); *H01L 2224/81447* (2013.01); *H01L 24/81* (2013.01); *H01L 24/05* (2013.01); *H01L 2224/14145* (2013.01); *H01L 2224/05647* (2013.01)
USPC .......... 257/738; 257/779; 257/E23.021; 257/E21.508; 438/612; 438/613

(58) Field of Classification Search
USPC .......... 257/737, 738, 779, 780, E23.021, 257/E21.508; 438/612, 613
See application file for complete search history.

(56) References Cited

U.S. PATENT DOCUMENTS

| 7,135,355 | B2 | 11/2006 | Chan et al. |
| 7,956,461 | B2 * | 6/2011 | Iwaki ............................. 257/737 |
| 2005/0167832 | A1 | 8/2005 | Kainou et al. |
| 2007/0001301 | A1 | 1/2007 | Wang |
| 2008/0217384 | A1 | 9/2008 | Jayantha et al. |
| 2009/0057887 | A1 | 3/2009 | Mclellan et al. |
| 2010/0187687 | A1 | 7/2010 | Liu et al. |
| 2011/0186988 | A1 | 8/2011 | Chen et al. |
| 2012/0012985 | A1 | 1/2012 | Shen et al. |
| 2012/0049351 | A1 | 3/2012 | Lee |
| 2012/0098120 | A1 | 4/2012 | Yu et al. |

FOREIGN PATENT DOCUMENTS

KR    20120054757 A    5/2012

\* cited by examiner

OTHER PUBLICATIONS

International Search Report and Written Opinion—PCT/US2013/049682—ISA/EPO—Feb. 14, 2014.

Primary Examiner — Hoai V Pham
(74) Attorney, Agent, or Firm — Michelle S. Gallardo

(57) ABSTRACT

Some exemplary embodiments of this disclosure pertain to a semiconductor package that includes a packaging substrate, a die and a set of under bump metallization (UBM) structures coupled to the packaging substrate and the die. Each UBM structure has a non-circular cross-section along its respective lateral dimension. Each UBM structure includes a first narrower portion and a second wider portion. The first narrower portion has a first width. The second wider portion has a second width that is greater than the first width. Each UBM structure is oriented towards a particular region of the die such that the first narrower portion of the UBM structure is closer than the second wider portion of the UBM structure to the particular region of the die.

58 Claims, 19 Drawing Sheets

Top View

NON-CIRCULAR UNDER BUMP METALLIZATION (UBM) STRUCTURE, ORIENTATION OF NON-CIRCULAR UBM STRUCTURE AND TRACE ORIENTATION TO INHIBIT PEELING AND/OR CRACKING

CLAIM OF PRIORITY UNDER 35 U.S.C. §119

The present application claims priority to U.S. Provisional Application No. 61/669,334 entitled "Non-Circular Under Bump Metallization (UBM), Orientation of Non-Circular UBM and Trace Orientation to inhibit Peeling and/or Cracking", filed Jul. 9, 2012, which is hereby expressly incorporated by reference herein.

FIELD

Various features relate to a die comprising a non-circular under bump metallization (UBM) structure, and more particularly, UBM structures on a die and traces on a packaging substrate that are aligned in a particular direction to minimize die cracking.

BACKGROUND

Traditionally, wire bonding is used to connect input/output (I/O) terminals (i.e., connection points) of a die to a package. More recently, under bump metallization (UBM) has been used as I/O terminals to connect the die to a packaging substrate. Traditional UBMs have a circular cross-section shape and provide several advantages over traditional wire bonding. UBMs are smaller than wire bonding, thus a die can have more I/O terminals by using UBMs than wire bonding. Therefore, UBMs can effectively increase the density of I/O terminals on a die. In addition, since UBMs are direct and short connections between the die and the packaging substrate, UBMs have higher speed performance relative to wire bonding.

A typical die is fabricated by depositing several metal and dielectric layers on top of a substrate. The substrate, metal layers and dielectric layers are what form the circuit elements of the die. The process of fabricating UBMs consists of depositing a metallization layer on top of a conventional top layer of the die. This metallization layer is what forms the UBMs. Solder is then deposited on the UBMs. Once the solder is deposited, the die is flipped and connected to a packaging substrate by connecting the solder to traces on the packaging substrate.

FIG. 1 illustrates a portion of a die that includes a UBM. As shown in FIG. 1, the portion of the die 100 includes a substrate 102, several metal and dielectric layers 104, a passivation layer 106, a UBM 108 and a solder 110. The substrate 102, metal and dielectric layers 104 form the circuit elements of the die 100. The passivation layer 106 is a protective layer of the die 100. The passivation layer 106 is a dielectric that is deposited over the last metal layer of the die 100. As shown in FIG. 1, the UBM 108 is fabricated on top of an opening in the passivation layer 106. The opening is created by etching the passivation layer 106. This opening in the passivation layer 106, once filled, becomes part of the UBM 108. Although not shown in FIG. 1, the UBM 108 has a circular cross-section. Once the UBM 108 is fabricated, a solder 110 is deposited on top of the UBM 108. In some implementations, the UBM 108 and the solder 110 are collectively referred to as a bump. Once this process is complete, the die 100 is flipped upside down and connected to a packaging substrate (not shown).

FIG. 2 illustrates an example of a portion of a die being connected to a portion of a packaging substrate. As shown in FIG. 2, the die 100 of FIG. 1 has been flipped and is being connected to a packaging substrate 200 that includes a trace 202. FIG. 2 illustrates that the solder 110 is being connected to the trace 202 of the packaging substrate 200. FIG. 2 only shows one solder being connected to a trace. However, in other instances, a die will have many UBMs and solders and a packaging substrate will have many traces. In such instances, each solder on the die will be connected to a respective trace on the packaging substrate.

One major drawback of connecting the die to the packaging substrate using this process is that a lot of stress (e.g., thermal stress, mechanical stress) is applied to the die. Thermal stress is the result of the substrate of the die having a different coefficient of thermal expansion than the coefficient of thermal expansion of the packaging substrate. Thus, the substrate of the die and the packaging substrate will expand or contract differently based on its respective coefficient of thermal expansion. The differences in expansion and contraction between the two substrates causes stress to be applied on the other components of the die and the package, including the metal layers, the dielectric layers, the passivation layer, the UBMs, the solders and the traces. The metal layers, the dielectric layers and the passivation layer are especially susceptible to stress. In particular, low K (LK) dielectrics or extremely low K (ELK) dielectrics tend to be brittle and can easily crack under stress.

Typically, large UBMs will absorb much of the stress between the two substrates, thereby reducing the likelihood of the cracking and/or delamination of the die. However, there is a trend towards the UBMs getting smaller and smaller in order to put as many UBMs on a die as possible while at the same time satisfying minimum pitch requirements between traces on the packaging substrate. With smaller size UBMs, this invariably leads to more stress being applied on other parts of the die, including the metal layers, the dielectric layers and the passivation layer. This can result in the cracking and/or delamination of the die, which ultimately results in a defective die.

As mentioned above, the density or number of UBMs on a die is limited by minimum pitch requirements. FIG. 3 illustrates examples of minimum pitch requirements. A pitch is defined as the center-to-center distance between two elements/structures on a die and/or package. For example, a pitch may be defined as the center-to-center distance between two neighboring traces or two neighboring UBMs. FIG. 3 illustrates a longitudinal pitch between a first UBM 300 and a second UBM 302. FIG. 3 also illustrates a lateral pitch between the second UBM 302 and a third UBM 304. These longitudinal and lateral pitches may be minimum pitch requirements for the die and/or substrate package. Minimum pitch requirements are required in a die and/or substrate to insure that there is enough spacing between elements/structures. This is done to reduce or avoid crosstalk that may occur when elements/structures are too close to each other. Minimum pitch requirements may also be required because of concerns for shorting and dielectric breakdown. FIG. 3 also illustrates a bump to trace clearance between the UBM 304 and the trace 306. This clearance specifies the minimum distance between the edge of a UBM and the edge of a trace in order to avoid or reduce crosstalk. Thus, there are dueling concerns when designing a UBM, on one hand, the UBMs have to be large enough in order to absorb the amount of stress that is put on a die, but at the same time the UBMs have to be small enough to meet minimum pitch requirements.

Therefore, there is a need for an improved UBM design that minimizes the likelihood of the die cracking and/or die delamination when the die is coupled to a semiconductor package.

SUMMARY

Various features relate to a die comprising a non-circular under bump metallization (UBM) structure, and more particularly, UBM structures on a die and traces on a packaging substrate that are aligned in a particular direction to minimize die cracking.

A first example provides a semiconductor package that includes a packaging substrate, a die and a set of under bump metallization (UBM) structures coupled to the packaging substrate and the die. Each UBM structure has a non-circular cross-section along its respective lateral dimension. Each UBM structure includes a first narrower portion and a second wider portion. The first narrower portion has a first width. The second wider portion has a second width that is greater than the first width. Each UBM structure is oriented towards a particular region of the die such that the first narrower portion of the UBM structure is closer than the second wider portion of the UBM structure to the particular region of the die.

According to an aspect, each UBM structure is oriented on the die such that the first narrower portion of the UBM structure is susceptible to compression stress, and the second wider portion of the UBM structure is susceptible to peeling stress, the second wider portion being on an opposite end of the first narrower portion of the UBM structure.

According to one aspect, each UBM structure has a longitudinal axis that is oriented towards the particular region of the die. In some implementations, the longitudinal axis of each UBM structure is oriented towards the particular region of the die to prevent delamination of the die.

According to an aspect, the packaging substrate includes a set of traces. Each trace is coupled to a respective UBM structure. In some implementations, each trace is oriented towards the particular region of the die.

According to one aspect, at least one UBM structure is a dummy UBM structure that is unable to provide an electrical path between the die and the packaging substrate.

According to an aspect, the particular region is a center of the die.

According to one aspect, the set of under bump metallization (UBM) structures is a set of first under bump metallization (UBM) structures. The semiconductor package further includes a set of second bump metallization (UBM) structures coupled to the packaging substrate and the die. Each second UBM structure has a non-circular cross-section along its respective lateral dimension. Each second UBM structure includes a third narrower portion and a fourth wider portion. The third narrower portion has a third width. The fourth wider portion has a fourth width that is greater than the third width. Each second UBM structure is oriented towards the particular region of the die such that the third narrower portion of the UBM structure is farther than the fourth wider portion of the UBM structure to the particular region of the die.

According to an aspect, the non-circular cross-section of the UBM structure is a teardrop cross-section.

According to one aspect, the non-circular cross-section of the UBM structure has at least one corner.

According to an aspect, at least one UBM structure includes an inner portion located in an opening of a passivation layer of the die. In some implementations, the inner portion has a non-circular cross-section across its lateral dimension.

According to one aspect, the UBM structure is indirectly coupled to the die and the packaging substrate. In some implementations, the UBM structure is indirectly coupled to the packaging substrate through a connection with a solder and a trace. In some implementations, the UBM structure is indirectly coupled to the die through a connection with a metal layer.

According to an aspect, the semiconductor package is incorporated into at least one of a music player, a video player, an entertainment unit, a navigation device, a communications device, a mobile phone, a smartphone, a personal digital assistant, a fixed location terminal, a tablet computer, and/or a laptop computer.

A second example provides a die that includes at least one metal layer and a set of under bump metallization (UBM) structures coupled to the metal layer. Each UBM structure has a non-circular cross-section along its respective lateral dimension. Each UBM structure includes a first narrower portion and a second wider portion. The first narrower portion has a first width. The second wider portion has a second width that is greater than the first width. Each UBM structure is oriented towards a particular region of the die such that the first narrower portion of the UBM structure is closer than the second wider portion of the UBM structure to the particular region of the die.

According to an aspect, each UBM structure is oriented on the die such that the first narrower portion of the UBM structure is susceptible to compression stress, and the second wider portion of the UBM structure is susceptible to peeling stress, the second wider portion being on an opposite end of the first narrower portion of the UBM structure.

According to one aspect, each UBM structure has a longitudinal axis that is oriented towards the particular region of the die. In some implementations, the longitudinal axis of each UBM structure is oriented towards the particular region of the die to prevent delamination of the die.

According to an aspect, at least one UBM structure is a dummy UBM structure that is unable to provide an electrical path between the die and the packaging substrate when the die is coupled to the packaging substrate.

According to one aspect, the particular region is a center of the die.

According to an aspect, the die further includes a set of second bump metallization (UBM) structures coupled to the packaging substrate and the die. Each second UBM structure has a non-circular cross-section along its respective lateral dimension. Each second UBM structure includes a third narrower portion and a fourth wider portion. The third narrower portion has a third width. The fourth wider portion has a fourth width that is greater than the third width. Each second UBM structure is oriented towards the particular region of the die such that the third narrower portion of the UBM structure is farther than the fourth wider portion of the UBM structure to the particular region of the die.

According to one aspect, the UBM structure is indirectly coupled to the substrate.

According to an aspect, the non-circular cross-section of the UBM structure is a teardrop cross-section.

According to one aspect, the non-circular cross-section of the UBM structure has at least one corner.

According to an aspect, the die is incorporated into at least one of a music player, a video player, an entertainment unit, a navigation device, a communications device, a mobile phone, a smartphone, a personal digital assistant, a fixed location terminal, a tablet computer, and/or a laptop computer.

A third example provides a semiconductor package that includes a packaging substrate, a die and an interconnect means for protecting against mechanical and thermal stress. The interconnect means is coupled to the packaging substrate and the die. Each interconnect means has a non-circular cross-section along its respective lateral dimension. Each interconnect means includes a first narrower portion and a second wider portion. The first narrower portion has a first width. The second wider portion having a second width that is greater than the first width. Each interconnect means is oriented towards a particular region of the die such that the first narrower portion of the interconnect means is closer than the second wider portion of the interconnect means to the particular region of the die.

According to an aspect, each interconnect means is oriented on the die such that the first narrower portion of the interconnect means is susceptible to compression stress, and the second wider portion of the interconnect means is susceptible to peeling stress. The second wider portion is on an opposite end of the first narrower portion of the interconnect means.

According to one aspect, each interconnect means has a longitudinal axis that is oriented towards the particular region of the die. In some implementations, the longitudinal axis of each interconnect means is oriented towards the particular region of the die to prevent delamination of the die.

According to an aspect, the packaging substrate includes a set of traces. Each trace is coupled to a respective interconnect means. In some implementations, each trace is oriented towards the particular region of the die.

According to one aspect, at least one interconnect means is a dummy interconnect means that is unable to provide an electrical path between the die and the packaging substrate.

According to an aspect, the non-circular cross-section of the interconnect means is a teardrop cross-section.

According to one aspect, the non-circular cross-section of the interconnect means has at least one corner.

According to an aspect, at least one interconnect means includes an inner portion located in an opening of a passivation layer of the die. In some implementations, the inner portion has a non-circular cross-section across its lateral dimension.

According to one aspect, the semiconductor package is incorporated into at least one of a music player, a video player, an entertainment unit, a navigation device, a communications device, a mobile phone, a smartphone, a personal digital assistant, a fixed location terminal, a tablet computer, and/or a laptop computer.

A fourth example provides a die that includes at least one metal layer and an interconnect means for protecting against mechanical and thermal stress, the interconnect means coupled to the metal layer, wherein each interconnect means has a non-circular cross-section along its respective lateral dimension, each interconnect means includes a first narrower portion and a second wider portion, the first narrower portion having a first width, the second wider portion having a second width that is greater than the first width, each interconnect means oriented towards a particular region of the die such that the first narrower portion of the interconnect means is closer than the second wider portion of the interconnect means to the particular region of the die.

According to an aspect, each interconnect means is oriented on the die such that the first narrower portion of the interconnect means is susceptible to compression stress, and the second wider portion of the interconnect means is susceptible to peeling stress, the second wider portion being on an opposite end of the first narrower portion of the interconnect means.

According to one aspect, each interconnect means has a longitudinal axis that is oriented towards the particular region of the die. In some implementations, the longitudinal axis of each interconnect means is oriented towards the particular region of the die to prevent delamination of the die.

According to an aspect, at least one interconnect means is a dummy interconnect means that is unable to provide an electrical path between the die and a packaging substrate when the die is coupled to the packaging substrate.

According to one aspect, the non-circular cross-section of the interconnect means is a teardrop cross-section.

According to an aspect, the non-circular cross-section of the interconnect means has at least one corner.

According to one aspect, the die is incorporated into at least one of a music player, a video player, an entertainment unit, a navigation device, a communications device, a mobile phone, a smartphone, a personal digital assistant, a fixed location terminal, a tablet computer, and/or a laptop computer.

A fifth example provides a method for manufacturing an integrated circuit (IC). The method provides a die that has metal layers and dielectric layers. The method provides a set of under bump metallization (UBM) structures on the die. The providing of each UBM structure includes forming the UBM structure to include a non-circular cross-section along its respective lateral dimension, a first narrower portion and a second wider portion. The first narrower portion has a first width. The second wider portion has a second width that is greater than the first width. The method further positions the UBM structure to be oriented towards a particular region of the die such that the first narrower portion of the UBM structure is closer than the second wider portion of the UBM structure to the particular region of the die.

According to an aspect, each UBM structure is oriented on the die such that the first narrower portion of the UBM structure is susceptible to compression stress, and the second wider portion of the UBM structure is susceptible to peeling stress, the second wider portion being on an opposite end of the first narrower portion of the UBM structure.

According to one aspect, each UBM structure has a longitudinal axis that is oriented towards the particular region of the die.

According to an aspect, at least one UBM structure is a dummy UBM structure that is unable to provide an electrical path between the die and a packaging substrate when the die is coupled to the packaging substrate.

According to one aspect, providing the set of UBM structure further includes forming a set of second bump metallization (UBM) structures on the die, where each second UBM structure has a non-circular cross-section along its respective lateral dimension, each second UBM structure includes a third narrower portion and a fourth wider portion, the third narrower portion having a third width, the fourth wider portion having a fourth width that is greater than the third width. The providing of the set of UBM structure also includes positioning each second UBM structure to be oriented towards the particular region of the die such that the third narrower portion of the UBM structure is farther than the fourth wider portion of the UBM structure to the particular region of the die.

According to an aspect, the non-circular cross-section of the UBM structure is a teardrop cross-section.

According to one aspect, the non-circular cross-section of the UBM structure has at least one corner.

According to an aspect, the method further includes providing a set of traces for a packaging substrate. The method also includes bonding the die to the packaging substrate by coupling at least some of the UBM structures of the die to the traces of the packaging substrate. In some implementations, the set of traces are aligned towards the particular region of the die, when the die is bonded to the packaging substrate.

According to one aspect, the die is incorporated into at least one of a music player, a video player, an entertainment unit, a navigation device, a communications device, a mobile phone, a smartphone, a personal digital assistant, a fixed location terminal, a tablet computer, and/or a laptop computer.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Some exemplary embodiments of this disclosure pertain to a semiconductor package that includes a packaging substrate, a die and a set of under bump metallization (UBM) structures coupled to the packaging substrate and the die. Each UBM structure has a non-circular cross-section along its respective lateral dimension (e.g., as viewed from a top and/or bottom perspective). Each UBM structure includes a first narrower portion and a second wider portion. The first narrower portion has a first width. The second wider portion has a second width that is greater than the first width. Each UBM structure is oriented towards a particular region of the die such that the first narrower portion of the UBM structure is closer than the second wider portion of the UBM structure to the particular region of the die. In some implementations, the UBM structures may have one of a rectangular, trapezoid, and/or teardrop cross-sectional shape along its lateral dimension (e.g., as viewed from a top and/or bottom perspective).

In some implementations, each UBM structure includes a first narrower portion and a second wider portion. The first narrower portion has a first width. The second wider portion has a second width that is greater than the first width. Each UBM structure is oriented towards a particular region of the die such that the first narrower portion of the UBM structure is closer than the second wider portion of the UBM structure to the particular region of the die. In some implementations, each UBM structure is oriented on the die such that the first narrower portion of the UBM structure is susceptible to compression stress, and the second wider portion of the UBM structure is susceptible to peeling stress. The second wider portion may be on an opposite end of the first narrower portion of the UBM structure.

In some implementations, the semiconductor package also includes several traces, where each respective trace is coupled to a respective UBM structure. At least some of the traces may be oriented towards a region on the die (e.g., center of the die).

Exemplary Under Bump Metallization (UBM) Structure

Figure 4:
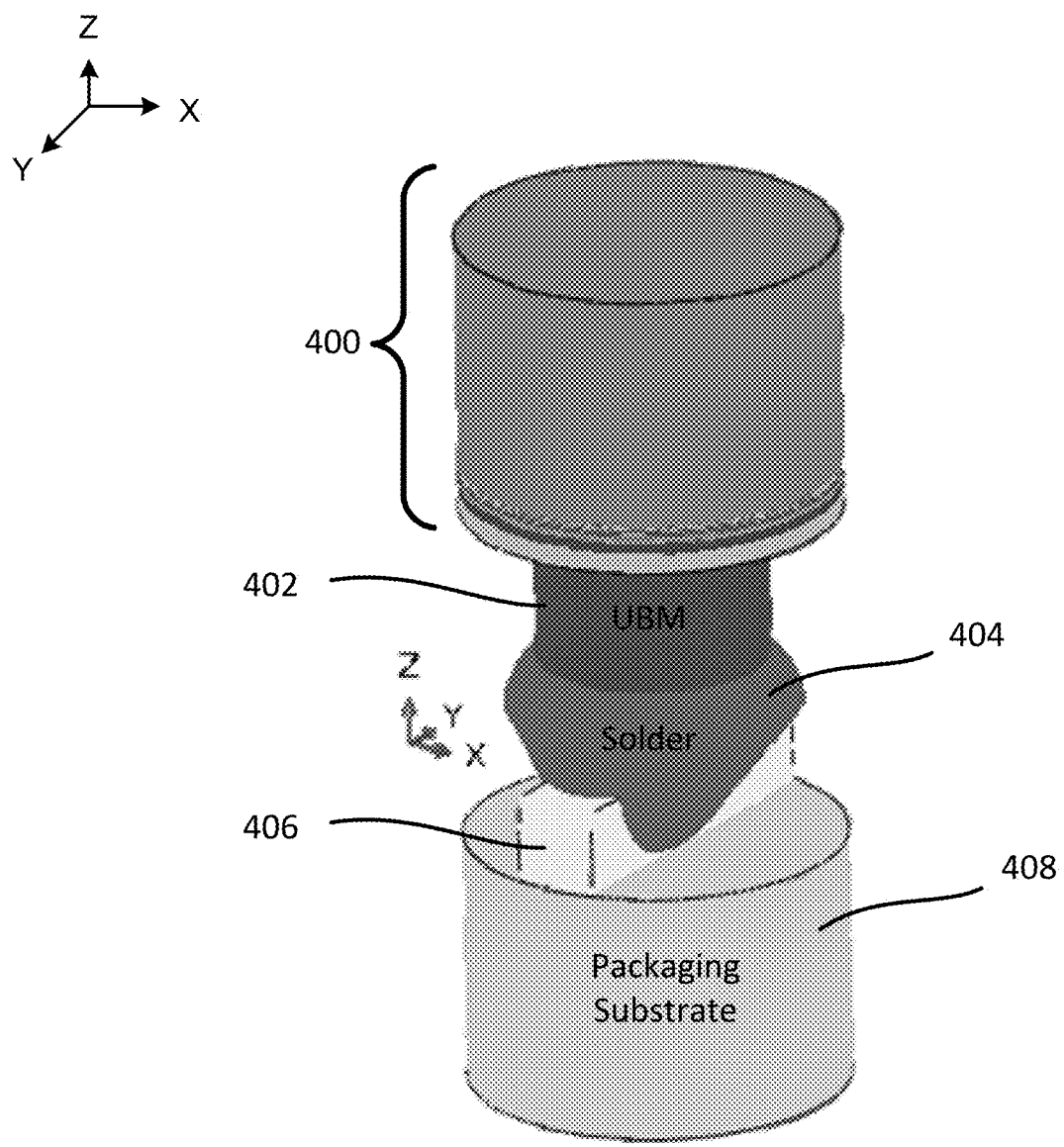
FIG. 4 illustrates a circular cutout cross-sectional view of a die coupled to a packaging substrate.

FIG. 4 illustrates a circular cutout cross-sectional view of a die coupled to a packaging substrate via an under bump metallization (UBM) structure in some implementations. Specifically, FIG. 4 illustrates a die 400, a UBM 402, a solder 404, a trace 406 and a packaging substrate 408. The die 400 may include several layers and/or components. For example the die 400 may include a die substrate, several conductive (e.g., metal) and dielectric layers, and a passivation layer. The die 400 may also include the UBM 402 in some implementations.

The UBM 402 is coupled to a die that has been flipped upside down and is formed by a conductive metal layer (e.g., copper) that is deposited on a layer of a die. In some implementations, the UBM 402 is a UBM structure that is deposited on top a metal layer (e.g., pad) of a die. The UBM structure has a thickness that is substantially larger than the thickness of a single metal/dielectric layer of a die. For example, the height of a UBM structure may be 10 microns (μm) or less, while the thickness of a metal layer and dielectric layer of die may be in a range of 0.01-5 microns (μm). For the purpose of the present disclosure, the term "UBM" shall include to mean a UBM structure. A UBM layer is thin metal layer (e.g., less than 5 microns) that is deposited over a die. In some implementations, the UBM structure is deposited over the UBM layer. The UBM structure may include the UBM layer in some implementations.

FIG. 4 also illustrates that the solder 404 is coupled to the UBM 402. More specifically, FIG. 4 illustrates the solder 404 coupled to the top portion (e.g., surface area of the UBM 402). In some implementations, the UBM 402 and the solder 404 are collectively referred to as a bump. The solder 404 is coupled to the trace 406, which is part of the packaging substrate 408 in some implementations. The trace 406 is a metal component, such as copper in some implementations.

Having described an overview of how a UBM/UBM structure may be utilized to couple a die to a packaging substrate, various implementations of UBMs/UBM structures will now be described below.

Figure 5:
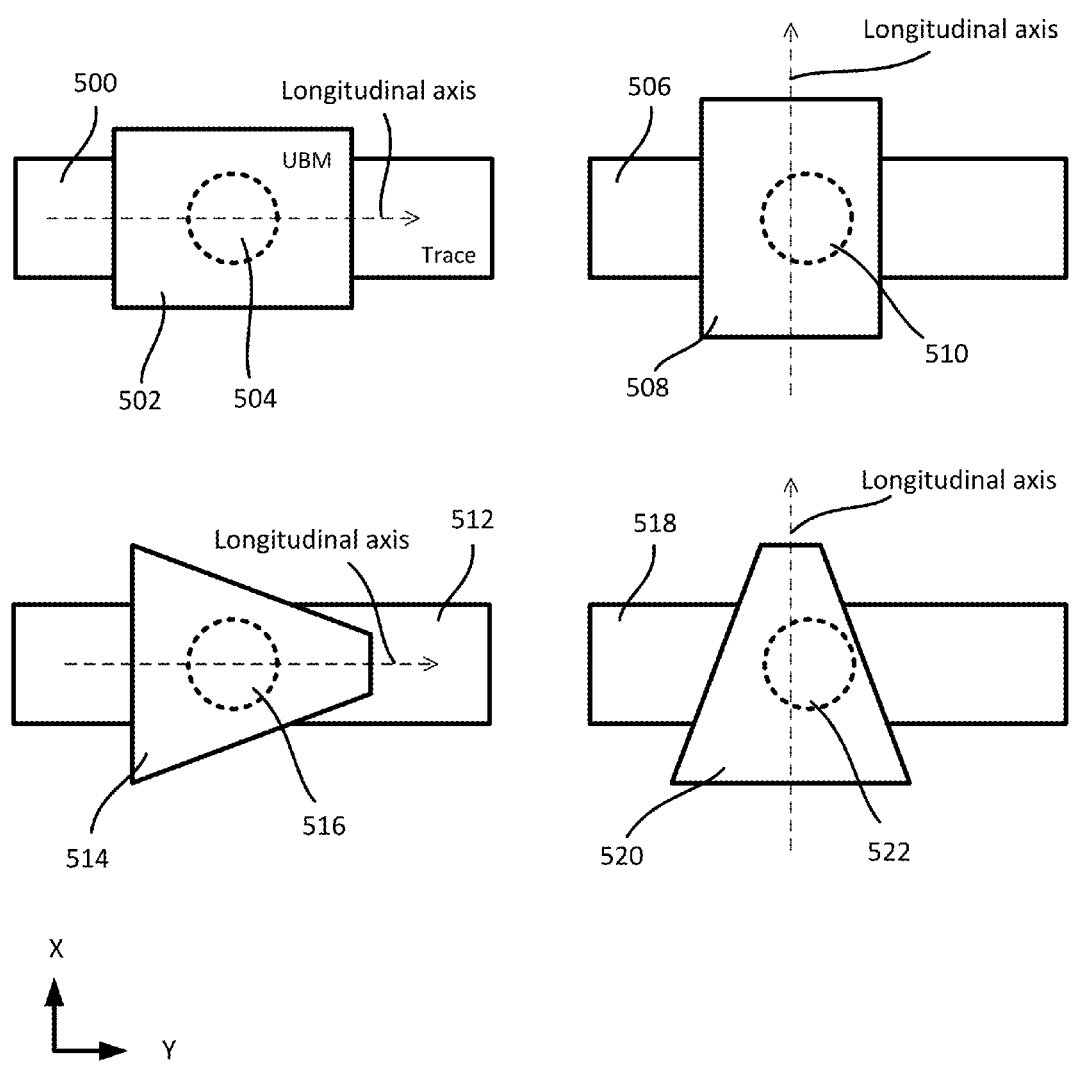
FIG. 5 illustrates a top view of several different non-circular UBMs.

FIG. 5 illustrates various UBMs with different non-circular cross-sections. As shown in FIG. 5, a UBM can have different shapes and can be oriented in different directions. The top left diagram illustrates a top view of a trace 500 and a UBM 502. The UBM 502 includes a portion 504 that is located in an opening of a passivation layer of a die. In some implementations, the portion 504 may be the pillar portion of the UBM 502. The UBM 502 has a rectangular shape and the longitudinal axis of the UBM 502 is along the same direction as the trace 500. The top right diagram illustrates a top view of a trace 506 and a UBM 508. The UBM includes a portion 510 that is located in an opening of a passivation layer of a die. The UBM 508 also has a rectangular shape. However, the longitudinal axis of the UBM 508 is perpendicular to the direction of the trace 506. In addition, the position of the portion 510 is offset to the center of the UBM 508. Although, the longitudinal axis of the UBM 508 is perpendicular to the direction of the trace 506, the longitudinal axis of the UBM 508 can be offset by any angle from the direction of the trace 506.

The bottom left diagram illustrates a top view of a trace 512 and a UBM 514. The UBM 514 has the shape of a trapezoid. The UBM 514 includes a portion 516 that is located in an opening of a passivation layer of a die. This portion 516 will further be described in FIG. 6. The longitudinal axis of the UBM 514 is along the same direction as the trace 512. The bottom right diagram illustrates a trace 518 and a UBM 520. The UBM 520 includes a portion 522 that is located in an opening of a passivation layer of a die. The UBM 520 also has a shape of a trapezoid. However, the longitudinal axis of the UBM 520 is perpendicular to the direction of the trace 518. In addition, the position of the portion 522 is offset to the center of the UBM 520. Although, the longitudinal axis of the UBM 520 is perpendicular to the direction of the trace 518, the longitudinal axis of the UBM 520 can be offset by any angle from the direction of the trace 518.

Figure 6:
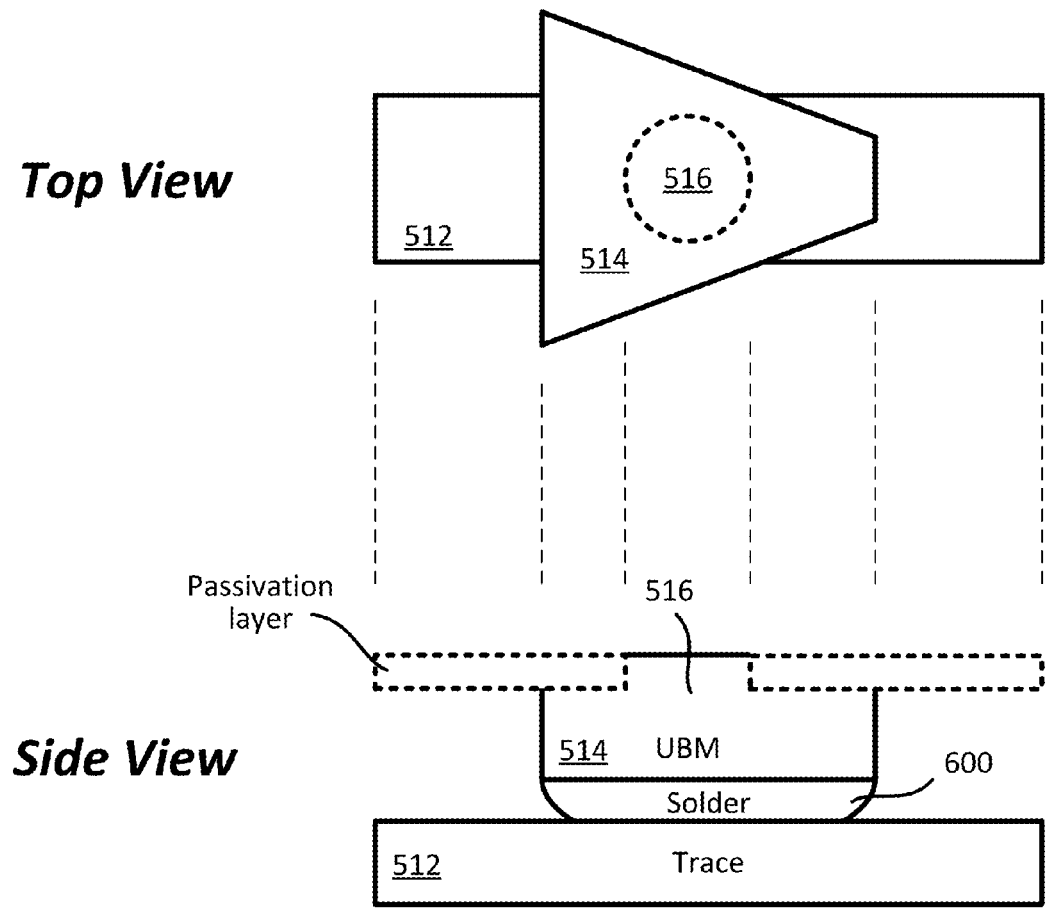
FIG. 6 illustrates a top view and a side view of a trapezoid shaped UBM.

Moreover, FIG. 5 illustrates portions 504, 510, 516 and 522 (which may be referred as pillar portions of the UBM structure) as having a circular cross-section. However, the portions 504, 510, 516 and 522 may also have a non-circular cross-section, such as a rectangular shape, teardrop shape, oval shape and/or trapezoid shape. Since these portions 504, 510, 516 and 522 may be in an opening of a passivation layer of a die, the opening of the passivation layer of a die may have a non-circular cross-section, such as a rectangular shape, teardrop shape, oval shape and/or trapezoid shape. In some implementations, the non-circular shape of the opening of the passivation layer may correspond to the non-circular shape of the portion (e.g., portions 504, 510, 516, 522) of the UBM structure. The dashed lines of the portions 504, 510, 516 and 522 represent the fact that the portions 504, 510, 516 and 522 may not be visible in some instances since the portions 504, 510, 516 and 522 are located in openings in the passivation layer of a die. FIG. 6, which will be described below, illustrates a side view of one of the above UBMs and the location of the UBM structure relative to a passivation layer of a die.

FIG. 6 illustrates a top view and a side view of one of the UBMs with a non-circular cross-section described in FIG. 5. Specifically, FIG. 6 illustrates a top view and a side view of UBM 514 of FIG. 5. As shown in FIG. 6, the UBM 514 is coupled to the trace 512 via a solder 600. The solder 600 is not visible in the top view because it is covered by the UBM 514. The portion 516 is part of the UBM 514 and is created in an opening in a passivation layer of a die. The portion 516 may be referred to as a pillar portion. FIG. 6 illustrates the portion 516 as having a circular cross-section. However, in some implementations, the portion 516 may also have a non-circular cross-section, such as a rectangular shape, teardrop shape, oval shape and/or trapezoid shape. Since the portion 516 is in an opening of a passivation layer of the die, the opening of the passivation layer of the die may have a non-circular cross-section, such as a rectangular shape, teardrop shape, oval shape and/or trapezoid shape. In some implementations, the non-circular shape/cross section of the opening of the passivation layer may correspond to the non-circular shape/cross-section of the portion (e.g., portion 516) of the UBM structure. In some implementations, a UBM structure may include a UBM and a pillar portion. In the side view, the portion 516 is surrounded by a passivation layer. However, in the top view of FIG. 6, the passivation layer is not shown for purposes of simplifying the illustration.

Figure 7:
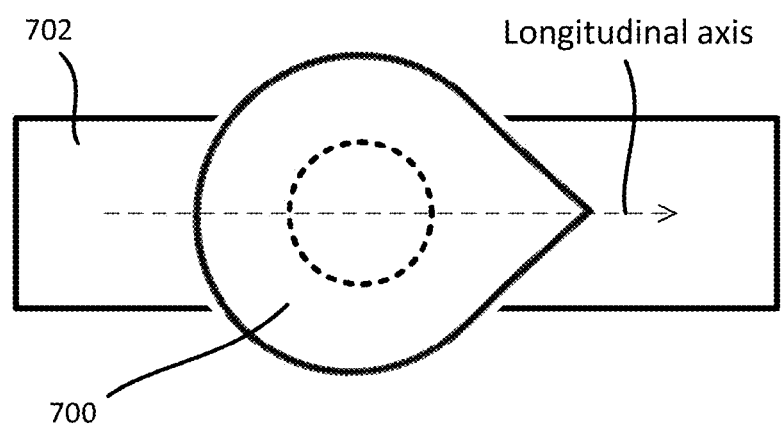
FIG. 7 illustrates a top view of a teardrop shaped UBM.
Figure 7:
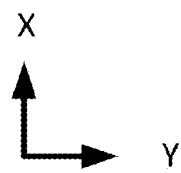

FIG. 7 illustrates another UBM with a non-circular cross-section shape. As shown in FIG. 7, the UBM 700 has a teardrop shape and the longitudinal axis of the UBM 700 is along the same direction as a trace 702. Other implementations may use different non-circular UBM shapes. For example, in some implementations, the cross-section of the UBM may have a polygon shape, a quadrilateral shape, or any shape having at least one corner. In some implementations, a non-circular cross-section may be any cross-section with an asymmetrical shape. That is, a non-circular shape is a shape that is asymmetrical along at least one direction and/or axis. In addition, a circular shape does not have a direction. Thus, another distinguishing feature of a non-circular shape over a circular shape is that a non-circular shape can have a direction. In some implementations, a direction of a non-circular shape may be defined as the direction of the longitudinal axis of the non-circular shape. In other instances, the direction may be defined along a different axis.

The shape and size of a UBM may be defined by several dimensions. A UBM may have a lateral dimension and a vertical dimension. The lateral dimension of the UBM defines the dimension of the UBM from the perspective of a top or bottom view of the UBM (e.g., along an X-Y plane). As such, the lateral dimension of the UBM defines the cross-sectional shape of the UBM. FIGS. 5-7 illustrate examples of a top view of the UBM and thus illustrate lateral dimensions of the UBMs. Examples of a lateral dimension may include width or length of the UBM. The lateral dimension of a UBM may also include the dimension of the UBM along the longitudinal axis of the UBM. In some implementations, the length of the UBM is the dimension of the UBM along the longitudinal axis of the UBM and the width of the UBM is the dimension of the UBM along a direction that is perpendicular to the longitudinal axis of the UBM.

Figure 1:
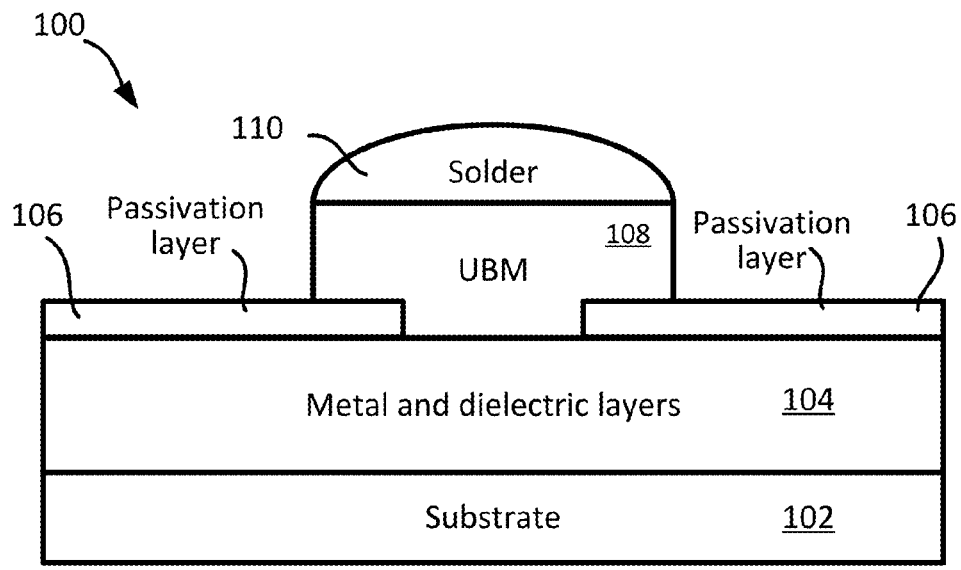
FIG. 1 illustrates a die with an under bump metallization (UBM) structure.
Figure 2:
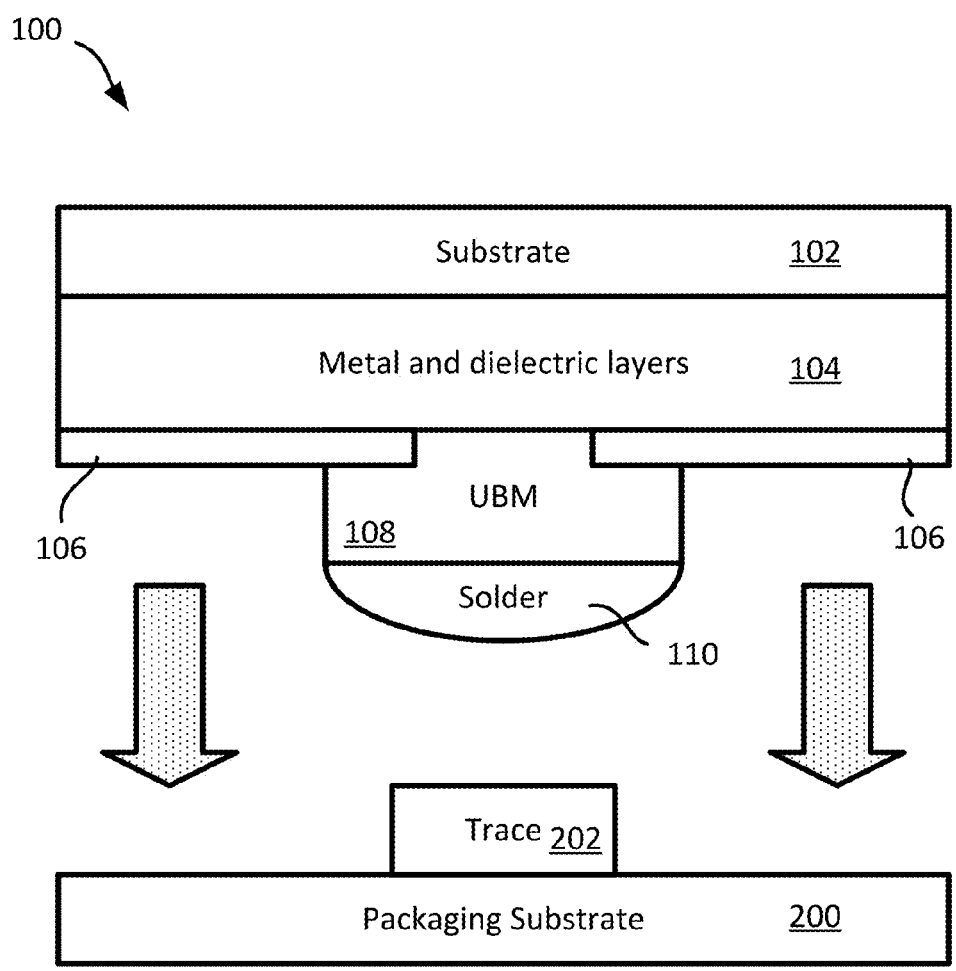
FIG. 2 illustrates a die being coupled to a packaging substrate.

The vertical dimension of the UBM defines the dimension of the UBM from the perspective of a side view of the UBM (e.g., along X-Z plane, Y-Z plane). As such, the vertical dimension of the UBM defines a profile shape of the UBM. FIGS. 1-2 and 6 illustrate examples of a side view of a UBM and thus illustrate vertical dimensions of the UBMs. Examples of a vertical dimension may include a depth of the UBM/UBM structure.

Figure 8:
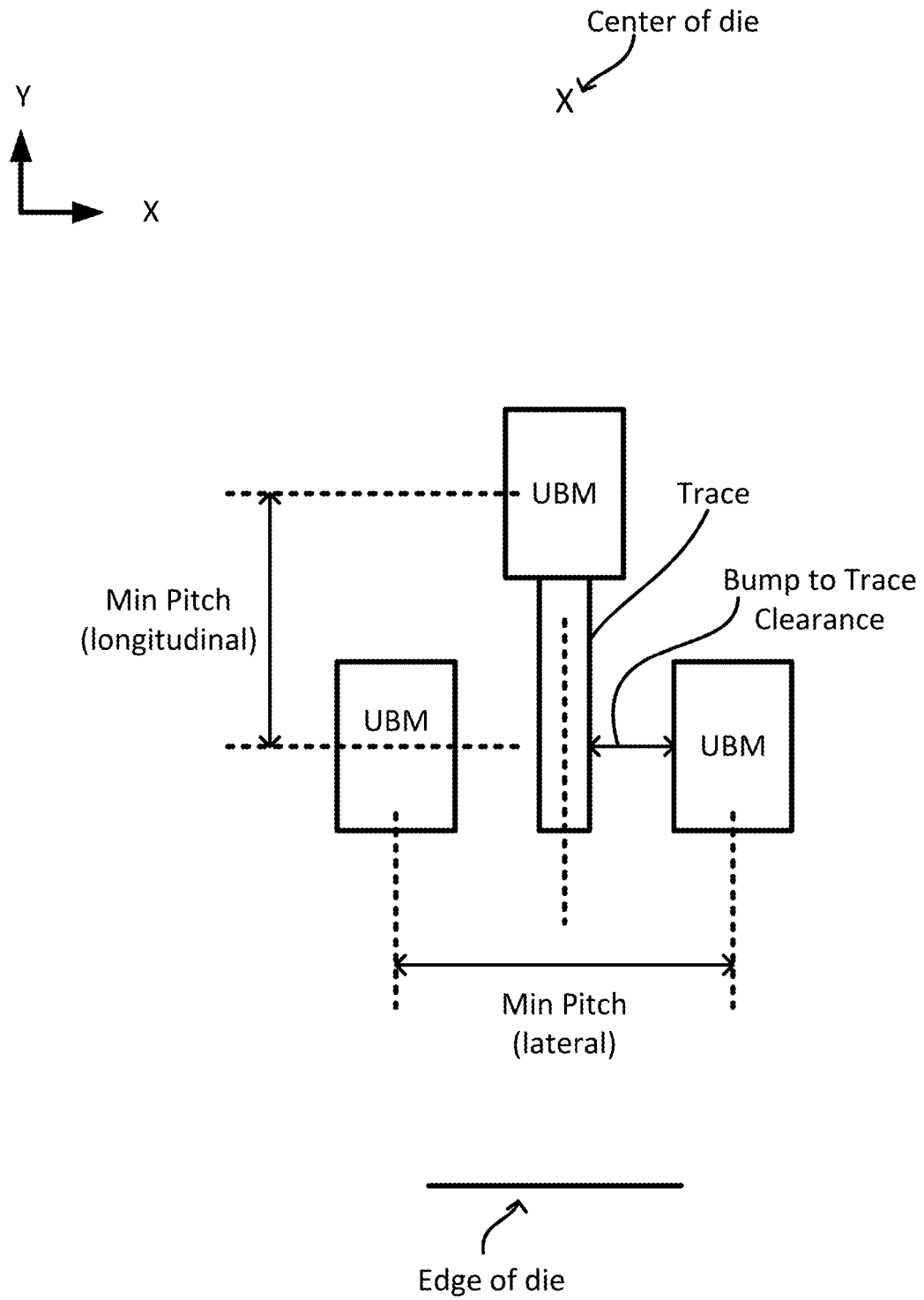
FIG. 8 illustrates a configuration of rectangular UBMs with minimum pitch requirements.
Figure 9:
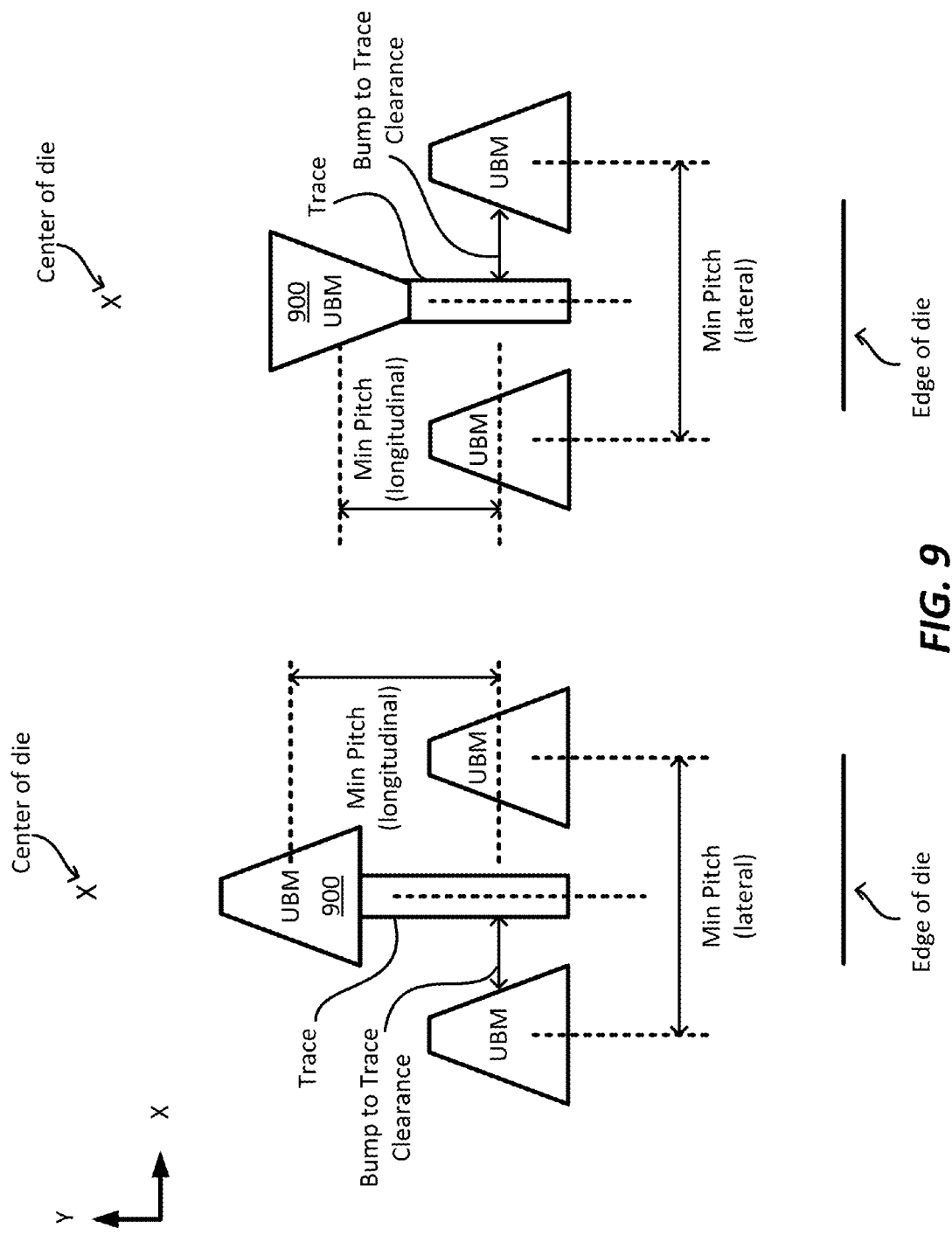
FIG. 9 illustrates various configurations of trapezoid UBMs with minimum pitch requirements.
Figure 10:
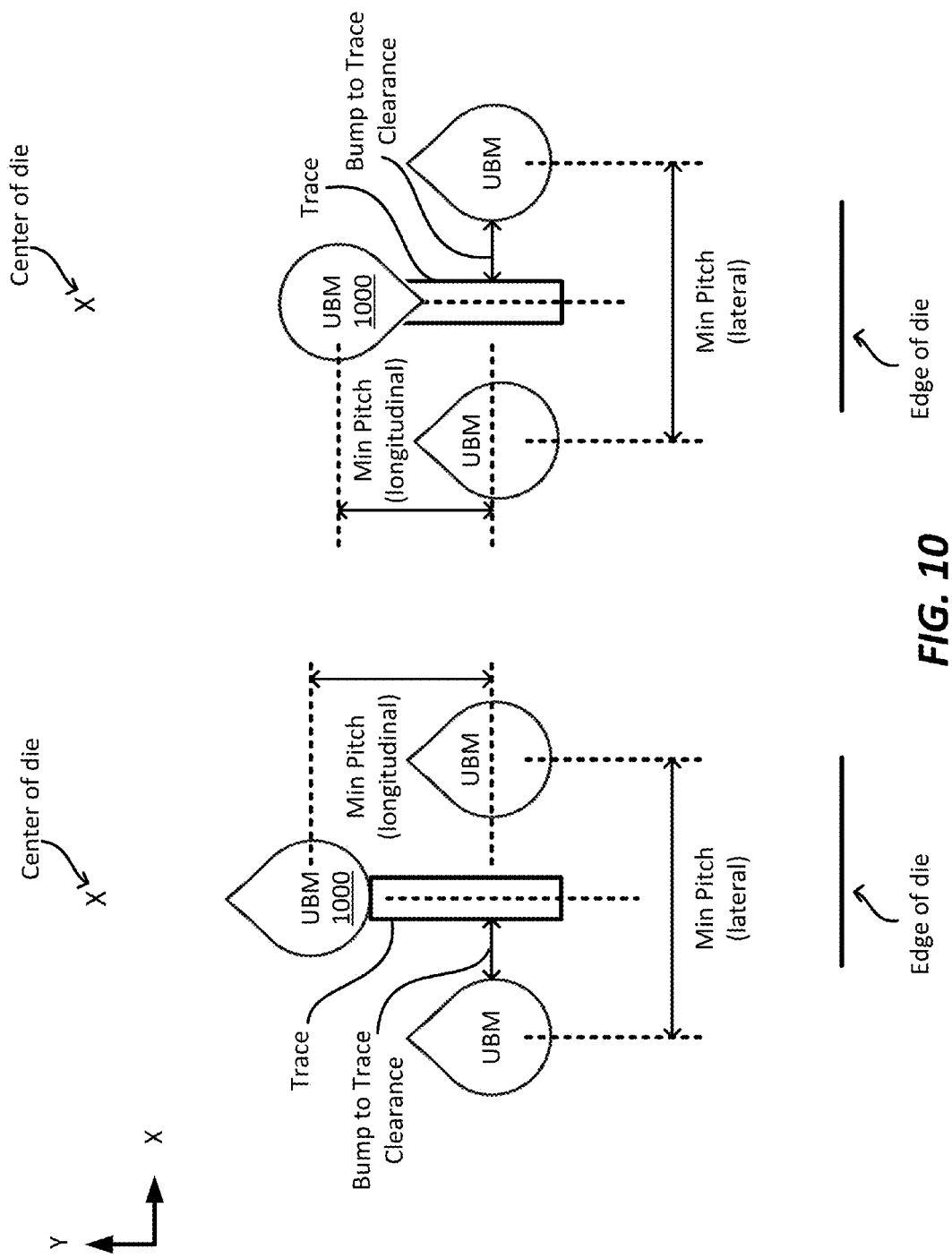
FIG. 10 illustrates various configurations of teardrop UBMs with minimum pitch requirements.

FIGS. 8-10 illustrate one of the benefits of using non-circular shape UBMs. Specifically, FIGS. 8-10 illustrate possible arrangements of three differently shaped UBMs. FIGS. 8-10 also illustrate the position and alignment of these differently shaped UBMs with respect to a die center and/or die edge in some implementations. It should be noted that the position of the die center and die edge in FIG. 8-10 are merely intended to show the general direction of the die center and the die edge with respect to the UBMs and do not necessarily represent the exact locations of the die center and die edge. FIG. 8 illustrates arrangements for rectangular shaped cross-section UBMs. FIG. 9 illustrates arrangements for trapezoid shaped cross-section UBMs. FIG. 10 illustrates arrangements for teardrop shaped cross-section UBMs.

Because of the shapes of these non-circular UBMs, these non-circular UBMs can meet the minimum pitch requirements and still prevent a die from cracking. That is, unlike the circular UBM of FIG. 3 (which for example has a diameter of 55 microns (µm)), a non-circular UBM (e.g., with a width of 55 µm) can be used on a die without the likelihood of the die cracking. This is possible for at least a couple of reasons.

Figure 3:
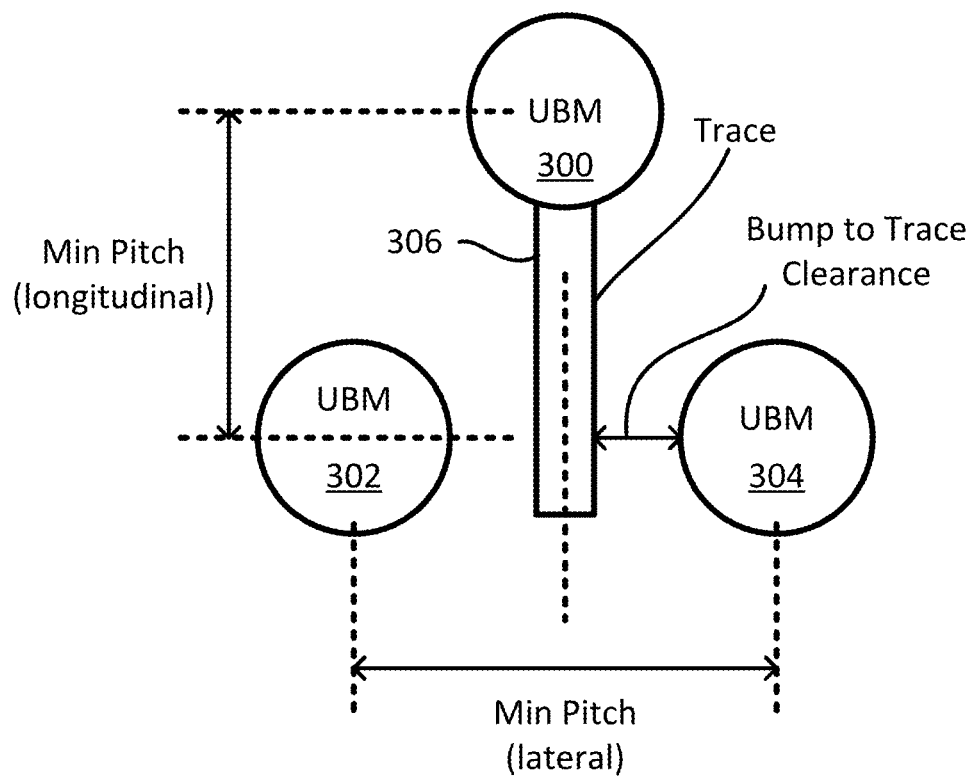
FIG. 3 illustrates minimum pitch requirements for circular UBMs.

First, the non-circular shaped UBMs have a greater area, despite the fact that the width of the non-circular UBM is the same as the diameter of the circular UBM of FIG. 3. For example, the rectangular shaped UBM may have a width of 55 µm and length of 70 µm, which has a greater area than a circular shaped UBM with a diameter of 55 µm. This greater area allows the rectangular shaped UBM to absorb more stress and makes it less likely for the die to crack. The same is true for the other non-circular shaped UBMs of FIGS. 9-10, which will be described later below.

Second, the alignment and/or orientation of the longitudinal axis of the UBMs along a direction (e.g., distance to neutral point (DNP) direction) reduces the amount of maximum ELK stress on the die. The stress benefit of the alignment and/or orientation of the UBMs will be further described below in the next section.

Another benefit of using non-circular UBMs is that more UBMs may be packed closer together in a die, by aligning some of the UBMs in different directions. FIG. 9 illustrates two different arrangements of trapezoid UBMs. In the arrangement on the left, the trapezoid UBMs are all aligned in the same direction. In the arrangement on the right, at least one of the trapezoid UBMs is aligned differently than other trapezoid UBMs. Specifically, in the arrangement on the right, the UBM 900 is aligned in a direction that is opposite than the other UBMs. In some implementations, doing so allows the UBMs to be close to each other without the possibility of crosstalk. Another benefit of doing this is there will be more space in-between those UBMs. The extra space may provide for better mold flow and lowers the risk of voids between the die and the package substrate when mold as underfill is used between the die and package substrate in some implementations. Thus, FIG. 9 illustrates that in the arrangement on the right, the longitudinal minimum pitch between UBMs can be smaller than the longitudinal minimum pitch in the arrangement on the left. This arrangement allows more UBMs to be packed in a given area of a die. In some implementations, more UBMs in a given area means that stresses during the assembly of the die to a packaging substrate is spread out over a larger number of UBMs, which means that each UBMs is subject to less stresses.

In one possible arrangement, a first row (or column) of UBMs are aligned in one direction (e.g., towards a center of the die), while a second row (or column) of UBMs are aligned in a different direction (e.g., opposite direction, such as away from the center of the die). In some implementations, subsequent rows and columns of UBMs with alternating alignment may be positioned in the die.

FIG. 10 illustrates the same concept as applied to a teardrop shaped UBMs in some implementations. As shown in FIG. 10, in the arrangement on the left, all the UBMs are aligned in the same directions (e.g., towards the center of a die), while in the arrangement on the right, at least one of the UBMs is aligned in a direction that is different (e.g., opposite direction) than the other UBMs. Specifically, in the arrangement on the right, the teardrop shape UBM 1000 is aligned in an opposite direction than the other UBMs. In some implementations, doing so, allows the UBMs to be close to each other, thereby reducing the minimum pitch between UBMs. In this example, the longitudinal minimum pitch in the arrangement on the right is less than the longitudinal minimum pitch in the arrangement on the left. As in the case of FIG. 9, the arrangement of FIG. 10 allows more UBMs to be packed in a given area. Thus, in some implementations, the non-circular UBMs (e.g., rectangular, teardrop, trapezoid) provide an interconnect means for protecting against mechanical and thermal stress.

Having described several possible orientation, alignments and/or arrangements for UBMs, exemplary stress regions on UBMs will now be described below.

Exemplary Stress Regions

Figure 11:
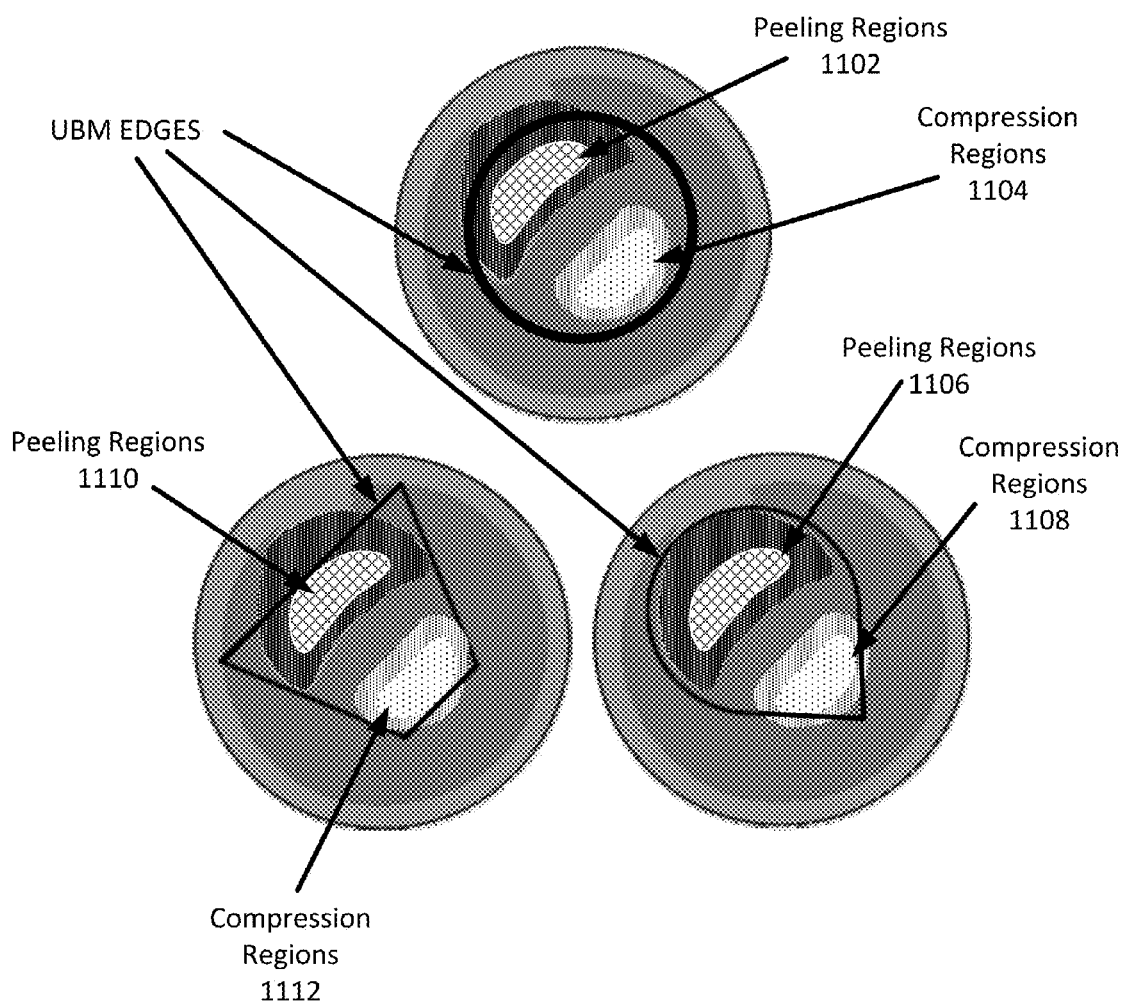
FIG. 11 illustrates stress levels for differently shape UBMs.

As mentioned above, the process of coupling a die to a packaging substrate results in a lot of stress being applied to the die. This stress can result in the cracking and/or delamination of the die. FIG. 11 illustrates the various stresses that can result around different UBMs during the process of assembling a die to a packaging substrate or when the die is connected to the packaging substrate. As mentioned above, the stress can be mechanical stress and/or thermal stress. Thermal stress is due to the substrate of the die and the packaging substrate each having different coefficient of thermal expansion and thus each of them expanding and contracting differently.

FIG. 11 illustrates several different regions under different types of stresses. In particular, FIG. 11 illustrates two different types of regions, one region under peeling and another region under compression. The regions 1102, 1106, and 110 indicate regions of peeling and the regions 1104, 1108, and 1112 indicate regions of compression. A peeling region is a region on the die where two or more layers are peeling off from each other. For example, peeling can occur between the UBM and the passivation layer. Peeling can also occur between the UBM and a metal layer (e.g., pad). In addition, peeling can occur between a metal layer and a dielectric layer. Delamination is what happens when one layer peels away from another layer. A compression region is a region where two or more layers are being compressed against each other. Compression can occur between the UBM and the passivation layer. Compression can also occur between the UBM and the metal layer (e.g., pad). Similarly, compression can occur between a metal layer and a passivation layer.

In many instances, the region of concern on a die is where peeling occurs since peeling causes delamination. UBMs can be designed and positioned on a die in such a way as to absorb as much peeling stress as possible, thereby reducing the amount of peeling stress that is subjected to other parts of the die (e.g., dielectric). For example, to minimize the likelihood of the die cracking and/or die delamination, the peeling stress in those peeling regions can be spread out over a large area of the UBM. In the case of a teardrop shape UBM, the portion of the teardrop with the larger surface area would be positioned where there is the most amount of peeling stress. Thus, as shown in FIG. 11, the peeling region 1106 is in a larger area of the teardrop shape UBM than the compression region 1108. By spreading the peeling stress across a larger area of the teardrop shape UBM, the die is less likely to crack or delaminate. It should be noted that the stress regions shown in FIG. 11 are merely examples of possible stress regions and is not intended to represent the exact stress levels that a die and/or a UBM structure may be subject to during an assembly process of the die to a packaging substrate.

Having described various stress regions, examples of methods for reducing and/or minimizing stress levels will now be described below.

Exemplary Orientation of UBMs and Traces

As described above, one way to reduce and/or minimize die cracking and/or die delamination is to have a UBM with a sufficiently large area. Another way to reduce the likelihood of a die cracking and/or die delamination is to orient the traces and/or UBMs towards a particular direction on the die.

Figure 12:
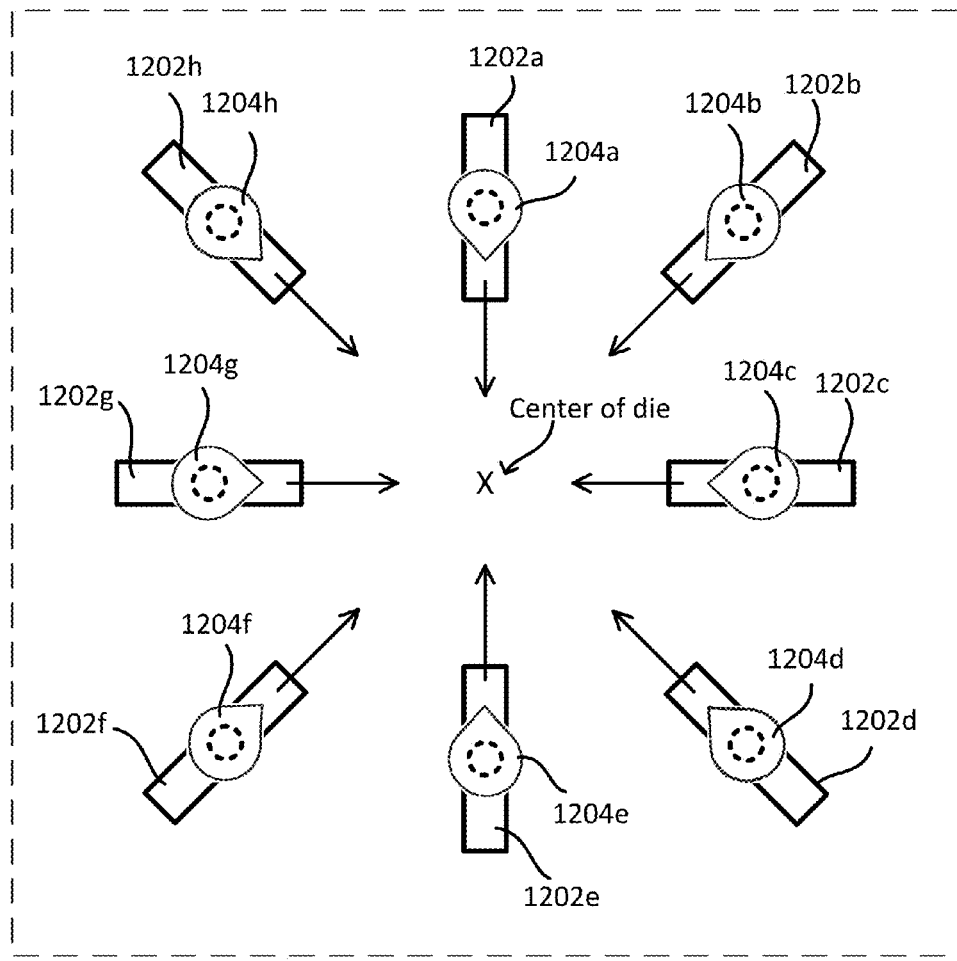
FIG. 12 illustrates UBMs and traces aligned towards a center of a die.

FIG. 12 illustrates a portion of die 1200 in a package that includes traces 1202a-h and UBMs 1204a-h. The UBMs 1204a-h have a teardrop shape. As shown in FIG. 12, the traces 1202a-h are all aligned towards the center of the die 1200. In addition, the longitudinal axes of the UBMs 1204a-h are oriented towards the center of the die. In the arrangement shown in FIG. 12, the corner portion of the trapezoid shape UBMs 1204a-h are all pointed towards the center of the die. Moreover, in this example, the traces 1202a-h and the UBMs 1204a-h are evenly distributed over the die. For purposes of clarity, FIG. 12 only shows a limited number of traces and UBMs. However, some implementations may include much more traces and UBMs on the die and packaging substrate.

In other implementations, the traces 1202a-h and UBMs 1204a-h may be unevenly distributed or concentrated along a certain region of the die. In such implementations, the traces 1202a-h and/or UBMs 1204a-h may be oriented towards a point and/or region on a die that is different than the center of the die. For example, if the traces 1202a-h and UBMs 1204a-h are only located along an upper region of a die, then the traces 1202a-h and/or the UBMs 1204a-h may be oriented towards a center point of the upper region of the die. In other cases, the traces 1202a-h and/or the UBMs 1204a-h may be oriented differently.

FIG. 12 illustrates one type of UBM shape being used, namely a teardrop shaped UBM. In other implementations, combinations of different shape UBMs may be used. For example, some implementations may use combinations of two or more UBMs with different cross-section shapes, such as a teardrop cross-section shape and trapezoid cross-section shape. In addition, some implementations may use different shapes for different regions of the die. For instances, one region of the die may use teardrop cross-section shaped UBMs, while another region of the die may use trapezoid cross-section shaped UBMs.

Figure 13:
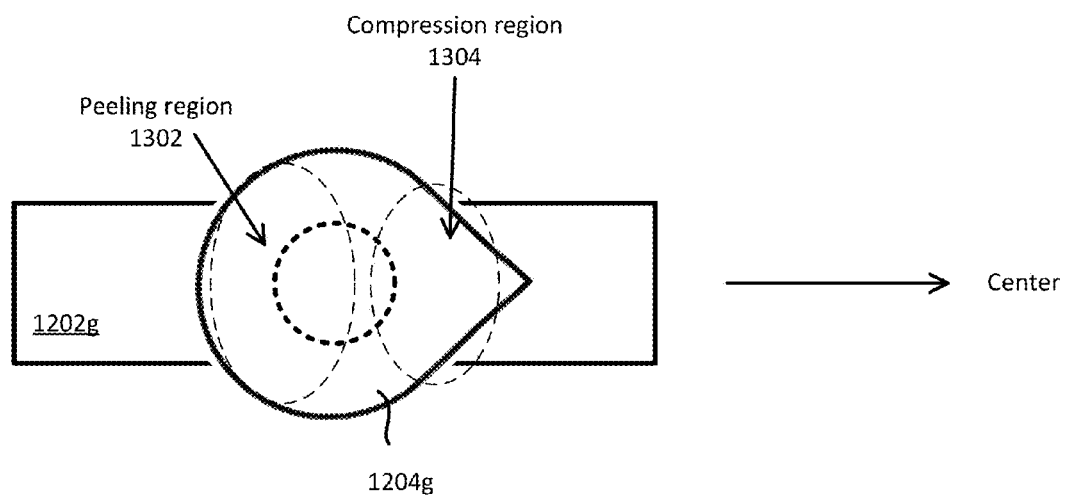
FIG. 13 illustrates a close up view of a teardrop shape UBM with stress regions showing.

FIG. 13 illustrates a close up view of one of the traces and UBMs of FIG. 12. Specifically, FIG. 13 illustrates a close up view of trace 1202g and UBM 1204g and the stress around the UBM 1204g. As shown in FIG. 13, the region around the UBM 1204g is subject to peeling and compression, which are represented by peeling region 1302 and compression region 1304. As described above, in many cases, peeling is more of a concern than compression. Therefore, the UBM 1204g is positioned and oriented in such a way so that a large portion of the UBM 1204g is over the peeling region 1302 so as to spread out the peeling stress over a large surface. In this example, the UBM 1204g has a teardrop shape cross-section. The teardrop shape cross-section has a portion with a corner. This portion is smaller than the portion on the opposite end of the corner of the teardrop shape. This smaller portion of the teardrop shape UBM 1204g is positioned and oriented in such a way as to be subjected to compression. The other and larger portion of the teardrop shape UBM 1204g is positioned and oriented to be subject to peeling. In other words, the UBM 1204g is positioned in such a way so that a larger portion (e.g., wider portion) of the UBM 1204g is susceptible to peeling and a smaller portion (e.g., narrow portion) of the UBM 1204g is susceptible to compression, where the smaller portion of the UBM 1204g is located on an opposite end of the larger portion of the UBM 1204g.

In some implementations, dummy UBMs may be placed to help absorb some of the stress during an assembly process. In some implementations, a dummy UBM is a UBM structure that does not provide any electrical path between the die and the package. Instead, the dummy UBM may simply be there so absorb some of the stress, thereby reducing the amount of stress on functioning UBMs (e.g., UBMs that provide an electrical path between the die and the package). The dummy UBMs may be positioned in area where there is a high likelihood of UBM failure in some implementations.

Figure 14:
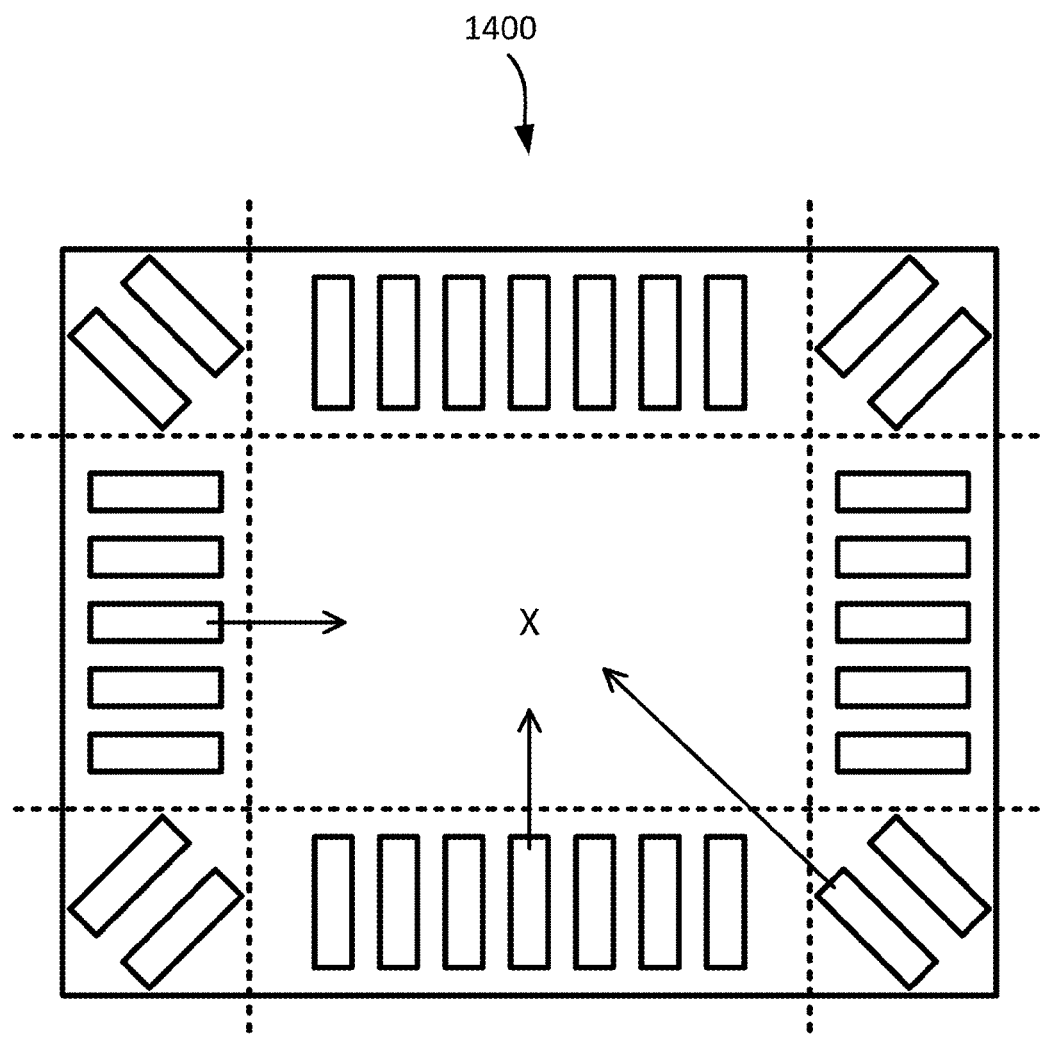
FIG. 14 illustrates traces aligned towards a center of a die.

FIGS. 12-13 illustrate that traces and UBMs are oriented towards a center in order to minimize stress or at least align stress in appropriate regions. However, in some implementation, only the traces are oriented towards the center of the die. FIG. 14 illustrates a top view of a portion of a packaging substrate 1400 with several traces. As shown in this figure, all the traces are oriented towards a center of a die (not shown) that the traces are going to be coupled to. The center of the die may be a center region or a center point of the die. Although, the traces are shown to be located at a perimeter, the traces can be located anywhere in the packaging substrate 1400. In addition, not all the traces have to be oriented exactly towards the center of the die. Instead, some or all of the traces may be oriented towards a general vicinity, region or area of the center of the die. The use of orienting or aligning traces towards a general direction can be used with circular UBMs in some implementations.

Figure 15:
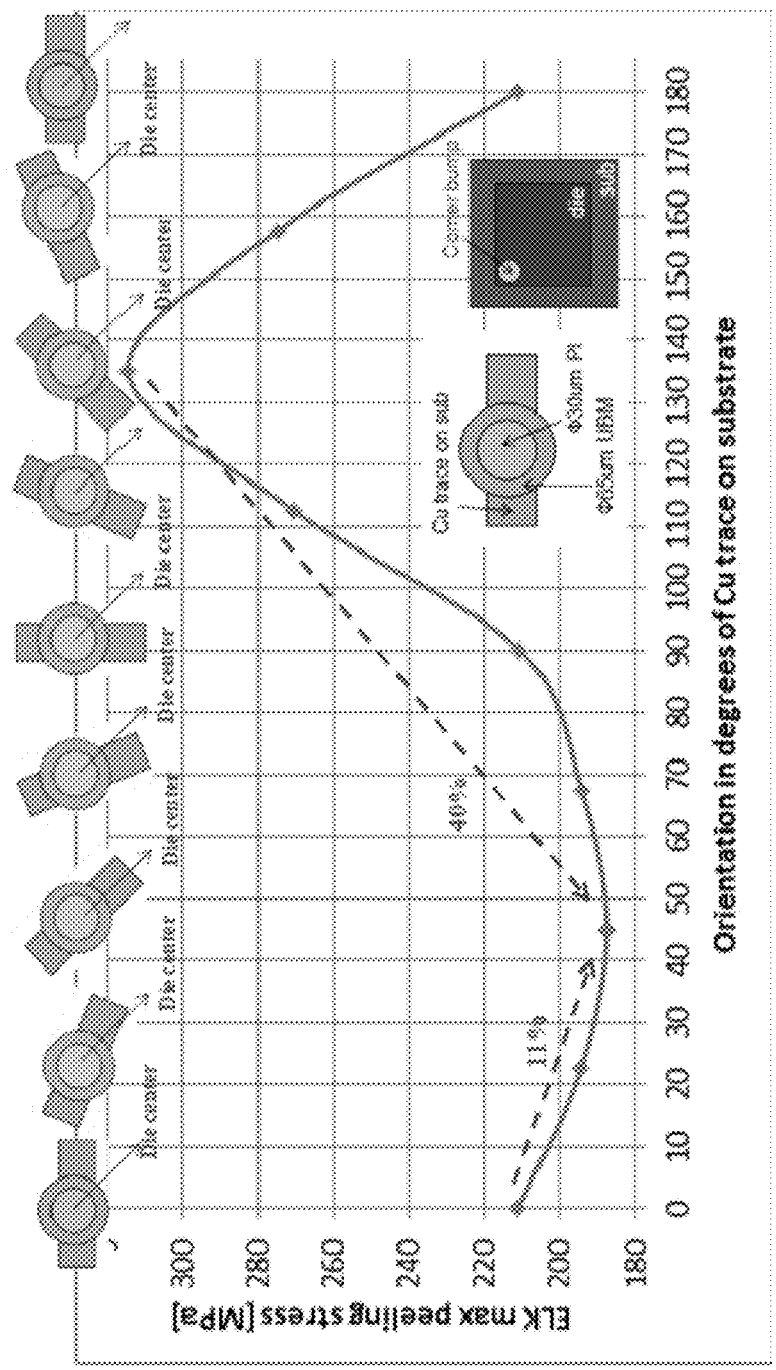
FIG. 15 illustrates the different stress levels on a die based on the orientation of a trace with a circular UBM.

As mentioned above, aligning/orienting the traces in a particular direction can substantially reduce the amount of stress around a UBM structure. FIG. 15 illustrates an exemplary graph detailing the amount of peeling stress that a region around a UBM can be subject to based on the orientation of a trace relative to a center of a die.

As shown in FIG. 15, the results were based on a circular shape cross section UBM that had a diameter of 65 microns (μm) and an inner diameter of 30 μm (the inner diameter corresponds to the diameter of the portion of the UBM in the opening of the passivation layer), coupled to a copper trace. The UBM was placed in a top left corner of a die. As shown in FIG. 15, the least amount of max peeling stress occurs when the trace is directly oriented (45 degrees) towards the center of the die. Moreover, the most amount of max peeling stress occurs when the orientation of the trace is perpendicular or tangent (135 degrees) to a direction that points towards the center of the die. The difference in max peeling stress between the two orientations is about 40%. Thus, it is clear that orienting or aligning a trace towards the center of the die reduces the amount of peeling stress on the region around the UBM.

Figure 16:
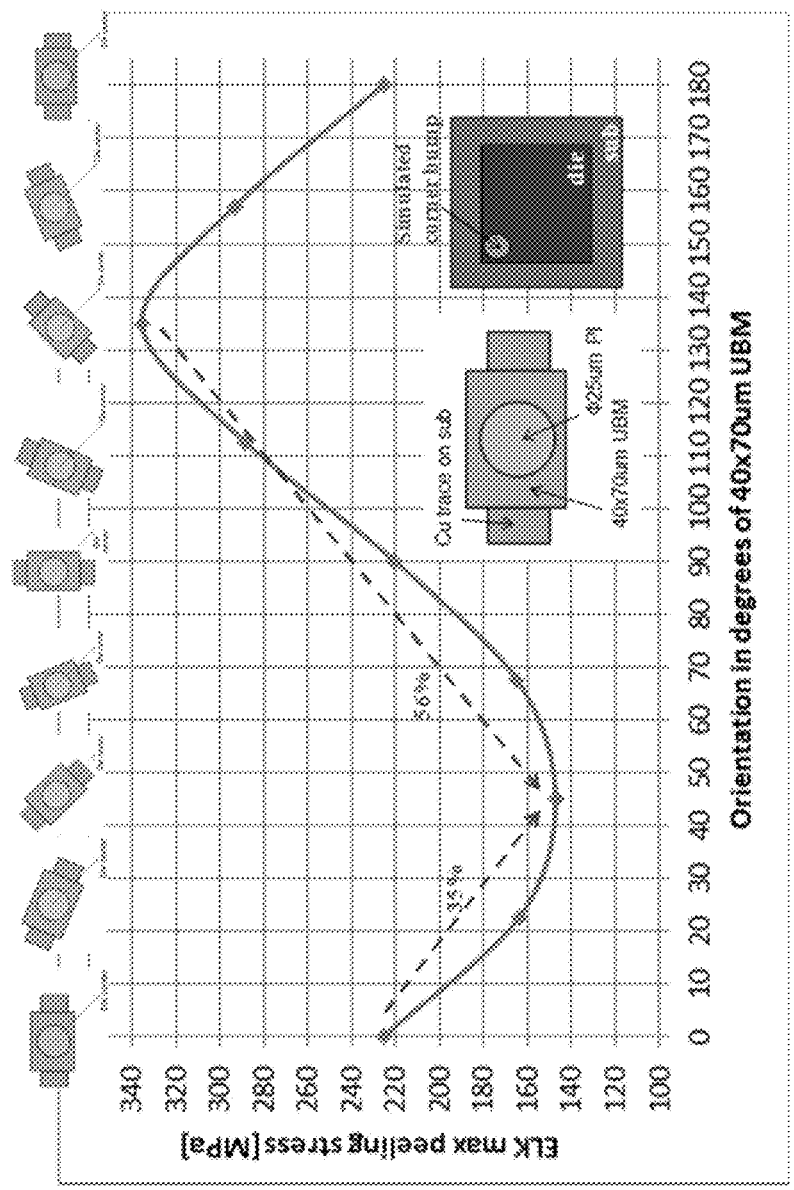
FIG. 16 illustrates the different stress levels on a die based on the orientation of a trace with a non-circular UBM.

FIG. 16 illustrates another graph detailing the levels of peeling stress that a region around a UBM can be subject to. FIG. 16 is similar to FIG. 15, except that the UBM has a rectangular shape cross-section instead of a circular shape cross-section. In addition, the rectangular shape cross-section UBM has a longitudinal axis that is always aligned with the direction of the trace. As shown in FIG. 11, the least amount of max peeling stress occurs when the trace and the UBM are oriented (45 degrees) towards the die center. Moreover, the most amount of max peeling stress occurs when the orientation of the trace and the UBM is perpendicular or tangent (135 degrees) to a direction that points towards the center of the die. The difference in max peeling stress between the two orientations in this example is about 56%.

It should be noted that the angles given above for FIGS. 15-16 are based on the location of the trace and UBM at the top left corner of the die. In instances where the trace and the UBM are located in a different location on the die, the angles mentioned above may be different.

Having described various non-circular UBMs with various orientation, alignment and/or configuration, a method for manufacturing a non-circular UBM will now be described below.

Exemplary Method for Manufacturing Die with Non-Circular UBMs

Having described various UBM structures, a method for manufacturing a die with a non-circular shape cross-section UBM structure will now be described. However, before describing a detailed method for manufacturing a die with a non-circular shape cross section UBM structure, an overview of a method for manufacturing a die with non-circular UBMs aligned towards a particular region and/or point on a die will first be described.

Figure 17:
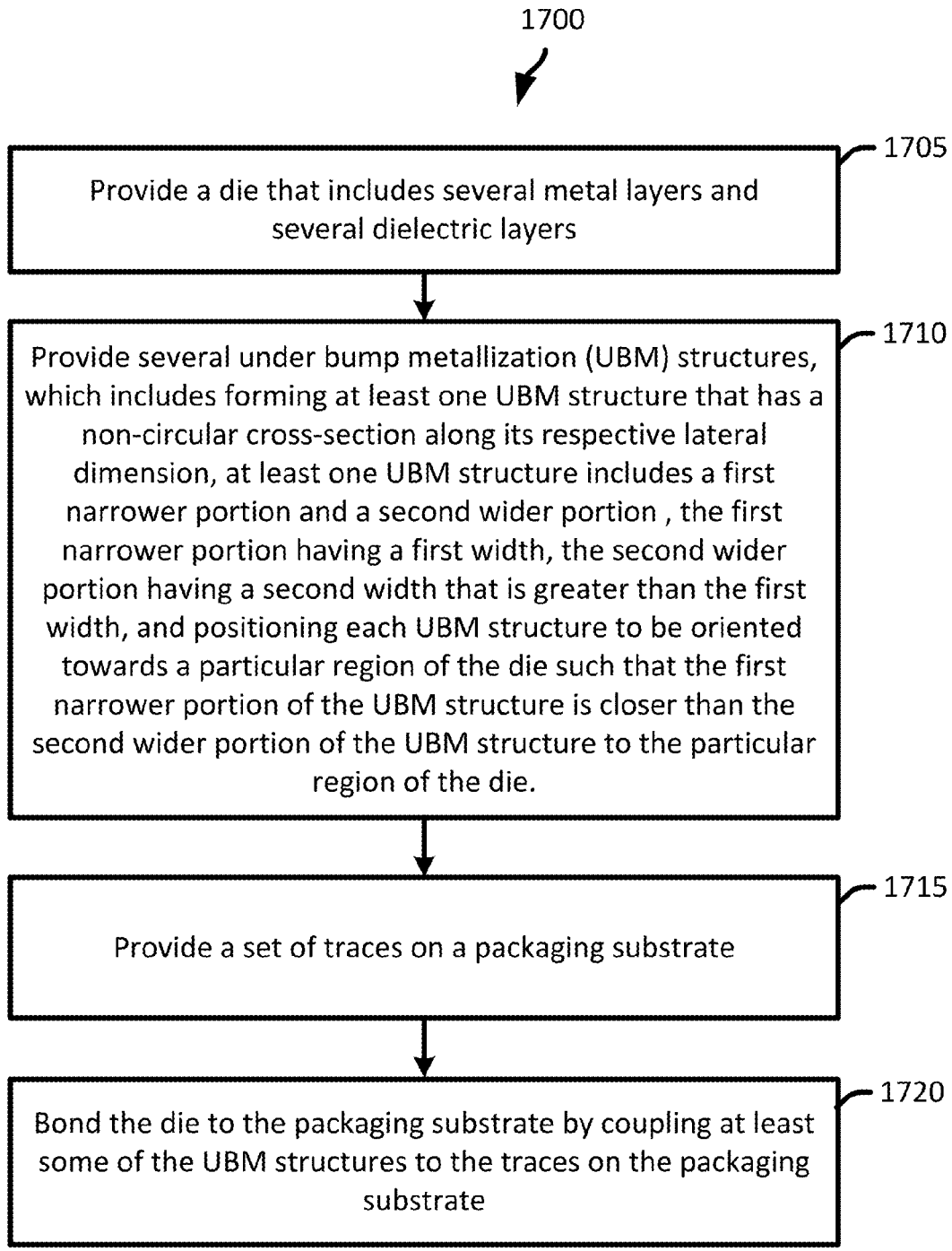
FIG. 17 illustrates a flow diagram of a method for manufacturing a die with non-circular UBMs.

FIG. 17 illustrates a flow diagram of a method for manufacturing a die that includes non-circular UBMs. For the purpose of clarity, not all the steps are necessarily shown in FIG. 17.

The method begins by providing (at 1705) a die that includes several metal and dielectric layers. Different implementations may use different manufacturing methods for providing a die that includes several metal and dielectric layers. An exemplary method for manufacturing a die is further described in FIG. 18.

Next, the method provides (at 1710) several UBM structures on the die. In some implementations, the UBM structure may be provided above metal layer (e.g., UBM layer) and/or dielectric layer (e.g., passivation layer). In some implementations, each UBM structure has a non-circular cross section along its lateral dimensions (e.g., along X-Y plane). In other instances, only some of the UBM structures have a non-circular cross section. A UBM structure may include a pillar portion. The pillar portion of the UBM structure may have circular or non-circular cross-section. Examples of non-circular cross sections for the UBM structure and/or the pillar portion include rectangle, oval, trapezoid, and/or teardrop. In some implementations, different combinations of non-circular cross-section UBMs (e.g., trapezoid and teardrop) may be provided. In some implementations, providing the UBM includes forming/manufacturing the UBM and positioning the UBM on the die.

Each non-circular UBM structure includes a first portion and a second portion. In some implementations, the first portion has a first width and the second portion has a second width that that greater than the first width of the first portion. In some implementations, the first width and the second width may be the same. In some implementations, each UBM structure is aligned towards a region of the die such that the first portion of the UBM structure is closer than the second portion of the UBM structure to the region of the die. The region of the die may be a center region or a center point of the die. This may be done so that first portion (which has a narrower width) of the UBM structure is subject to compression stress, while the second portion (which has a wider width) of the UBM structure is subject to peeling stress in some implementations.

However, in some implementations, some of the UBM structures are aligned in different directions than some of the other UBM structures. For example, a first set of UBM structures may be aligned towards a center region of the die, while a second of UBM structures may be aligned away (e.g., in the opposite direction) from the center region of the die. In some implementations, the orientation and/or alignment of the UBM structures on the die may alternate back and forth, from column to column, and/or row to row. For example, a first row may have UBM structures aligned towards a center of a die, a second row may have UBM structures aligned away from the center of the die, and a third row may have UBM structures aligned towards the center of the die. The alternating of the alignment may allow more UBM structures to be packed in a given area. As a result, the amount of stress from the assembly processes may be spread over a larger number of UBM structures, potentially reducing the amount of stress on each UBM structure. Thus, reducing the likelihood that of the die cracking and peeling. In addition, in some implementations, some of the defined UBM structures may be dummy UBM structures. These dummy UBM structures may have circular or non-circular cross sections.

Next, the method provides (at 1715) a set of traces on a packaging substrate. In some implementations, the set of traces are defined on the packaging substrate such that the set of traces are aligned towards a center region (e.g., center point) of a die that is going to be coupled to the packaging substrate. In some implementations, some of the set of traces are aligned towards a center region of the die.

The method then bonds (at 1720) the die to the packaging substrate by coupling at least some of the UBM structures on the die to at least some of the corresponding traces on the packaging substrate and ends. In some implementations, bonding the die to the packaging substrate includes coupling solder to the UBM structures of the die. Thus, when the method bonds (at 1720) the die to the packaging substrate, the solder acts as an intermediate between the UBM structures of the die and the traces of the packaging substrate. Different implementations may use different bonding processes for bonding the die to the packaging substrates. Examples of bonding processes include thermal compression bonding, and/or reflow bonding.

Having described an overview of manufacturing a die with non-circular UBM structure, a detailed method for manufacturing a die with a non-circular shape cross-section UBM structure will now be described.

Figure 18:
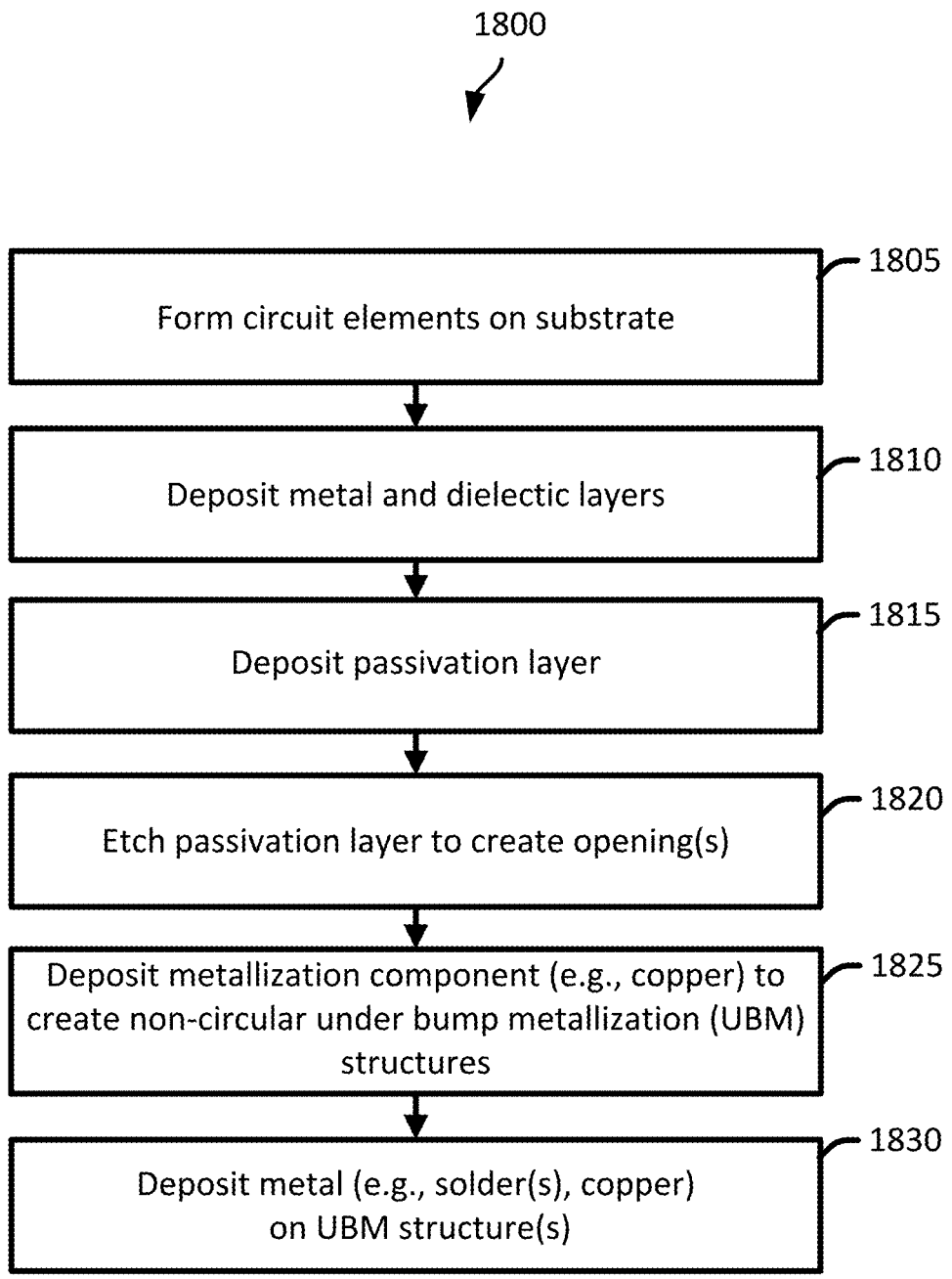
FIG. 18 illustrates a flow diagram of a method for manufacturing a die with non-circular UBMs.

FIG. 18 illustrates a method 1800 for manufacturing a die with a non-circular cross-section UBM structure. The method begins by forming (at 1805) circuit elements on a substrate. These circuit elements may include transistors, resistors, capacitors and diodes. In some implementations, this step is referred to as front-end-of-line (FEOL) processing. Next, the method deposits (at 1810) several metal layers and dielectric interlayers over the substrate. In some implementations, these metal layers define the interconnects (e.g., wires) that connect the circuit elements on the substrate. The dielectric interlayers are used to isolate the interconnects defined by the metal layers. Once the last metal layer has been deposited (at 1810), the method deposits (at 1815) a passivation layer. The passivation layer protects the metal layers from oxidation. The passivation layer may be a dielectric layer.

Next, the method etches (at 1820) the passivation layer to create one or more openings in the passivation layer. The opening may expose part of the top metal layer of the die. The opening may be circular or non-circular in some implementations. The method then deposits (at 1825) a metal component on top of the openings, which creates the under bump metallization (UBM) structure in each opening. The UBM structure has a non-circular cross-section shape. In some implementations, creating the non-circular cross-section shape UBM structure includes etching the metal layer deposited on top of the passivation layer. The UBM structure directly connects to the top metal layer in some implementations. Once the UBM structure has been created, the method deposits (at 1830) metal (e.g., solder, copper) on top of each UBM structure and ends. Once the metal (e.g., solder, copper)

is deposited on the UBM structure, the combination of the metal (e.g., solder, copper) and the UBM may be referred as a bump and/or solder bump. In some implementations, the depositing (at 1830) of the metal (e.g., solder, copper) on the UBM structure is done during an assembly process and not during the manufacturing of the die. That is, a die may be manufactured to include the UBM structure and during a subsequent assembly process (where the die is coupled to a packaging substrate that includes traces), solder is coupled to the UBM structure before the die is coupled to the packaging substrate.

Typically, multiple dice are manufactured at the same time on a wafer. In which case, the wafer is then cut into separate a die. However, for the purpose of clarity, the method of FIG. 18 is described as if only one die is being manufactured.

As mentioned above, once the die with a non-circular cross-section UBM structure is created, the die is coupled to a packaging substrate. The packaging substrate includes several traces which are created by etching a metal layer (e.g., copper), which is then bonded to the packaging substrate. The die couples to the packaging substrate via the solders and the traces.

Exemplary Electronic Devices

Figure 19:
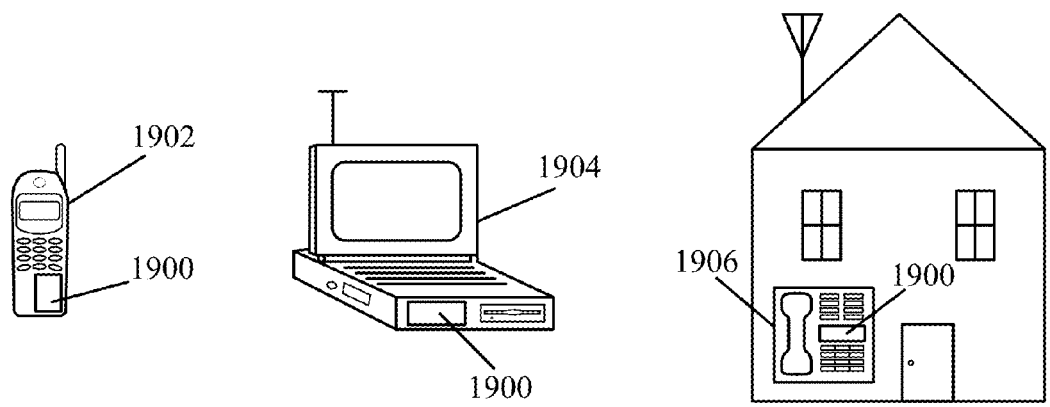
FIG. 19 illustrates various electronic devices that may integrate the IC described herein.

FIG. 19 illustrates various electronic devices that may be integrated with any of the aforementioned integrated circuit, die or package. For example, a mobile telephone 1902, a laptop computer 1904, and a fixed location terminal 1906 may include an integrated circuit (IC) 1900 having non-circular cross-section UBM as described herein. The IC 1900 may be, for example, any of the integrated circuits, dice or packages described herein. The devices 1902, 1904, 1906 illustrated in FIG. 19 are merely exemplary. Other electronic devices may also feature the IC 1900 including, but not limited to, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, the substrate of the die may be coupled to the packaging substrate even though the substrate of the die is never directly physically in contact with the packaging substrate.

The terms wafer and substrate may be used herein to include any structure having an exposed surface with which to form an integrated circuit (IC) according to aspects of the present disclosure. The term die may be used herein to include an IC. The term substrate is understood to include semiconductor wafers. The term substrate is also used to refer to semiconductor structures during fabrication, and may include other layers that have been fabricated thereupon. The term substrate includes doped and undoped semiconductors, epitaxial semiconductor layers supported by a base semiconductor, or semiconductor layers supported by an insulator, as well as other semiconductor structures well known to one skilled in the art. The term insulator is defined to include any material that is less electrically conductive than materials generally referred to as conductors by those skilled in the art. The term "horizontal" is defined as a plane substantially parallel to the conventional plane or surface of a wafer or substrate, regardless of the orientation of the wafer or substrate. The term "vertical" refers to a direction substantially perpendicular to the horizontal as defined above. Prepositions, such as "on," "upper," "side," "higher," "lower," "over," and "under" when used with respect to the integrated circuits described herein are defined with respect to the conventional plane or surface being on the top surface of the wafer or substrate, regardless of the orientation of the wafer or substrate. The prepositions "on," "upper," "side," "higher," "lower," "over," and "under" are thereby defined with respect to "horizontal" and "vertical."

One or more of the components, steps, features, and/or functions illustrated in FIGS. 4, 5, 6, 7, 8, 9, 10, 11, 12, 14, 15, 16, 17, 18 and/or 19 may be rearranged and/or combined into a single component, step, feature or function or embodied in several components, steps, or functions. Additional elements, components, steps, and/or functions may also be added without departing from the invention.

Also, it is noted that the aspects of the present disclosure may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the invention described herein can be implemented in different systems without departing from the invention. It should be noted that the foregoing aspects of the disclosure are merely examples and are not to be construed as limiting the invention. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A semiconductor package comprising:
a packaging substrate;
a die; and
a set of under bump metallization (UBM) structures coupled to the packaging substrate and the die, wherein each UBM structure has a non-circular cross-section along its respective lateral dimension, each UBM structure includes a first narrower portion and a second wider portion, the first narrower portion having a first width, the second wider portion having a second width that is greater than the first width, each UBM structure oriented towards a particular region of the die such that the first narrower portion of the UBM structure is closer than the second wider portion of the UBM structure to the particular region of the die, wherein the second wider portion is distal to the particular region of the die relative to a center of the non-circular cross-section.

2. The semiconductor package of claim 1, wherein each UBM structure is oriented on the die such that the first narrower portion of the UBM structure is susceptible to compression stress, and the second wider portion of the UBM structure is susceptible to peeling stress, the second wider portion being on an opposite end of the first narrower portion of the UBM structure.

3. The semiconductor package of claim 1, wherein each UBM structure has a longitudinal axis that is oriented towards the particular region of the die.

4. The semiconductor package of claim 3, wherein the longitudinal axis of each UBM structure is oriented towards the particular region of the die to prevent delamination of the die.

5. The semiconductor package of claim 1, wherein the packaging substrate includes a set of traces, each trace coupled to a respective UBM structure.

6. The semiconductor package of claim 5, wherein each trace is oriented towards the particular region of the die.

7. The semiconductor package of claim 1, wherein at least one UBM structure is a dummy UBM structure that is unable to provide an electrical path between the die and the packaging substrate.

8. The semiconductor package of claim 1, wherein the particular region is a center of the die.

9. The semiconductor package of claim 1, wherein the set of under bump metallization (UBM) structures is a set of first under bump metallization (UBM) structures, the semiconductor package further comprising a set of second bump metallization (UBM) structures coupled to the packaging substrate and the die, wherein each second UBM structure has a non-circular cross-section along its respective lateral dimension, each second UBM structure includes a third narrower portion and a fourth wider portion, the third narrower portion having a third width, the fourth wider portion having a fourth width that is greater than the third width, each second UBM structure oriented towards the particular region of the die such that the third narrower portion of the UBM structure is farther than the fourth wider portion of the UBM structure to the particular region of the die.

10. The semiconductor package of claim 1, wherein the non-circular cross-section of the UBM structure is a teardrop cross-section.

11. The semiconductor package of claim 1, wherein the non-circular cross-section of the UBM structure has at least one corner.

12. The semiconductor package of claim 1, wherein at least one UBM structure includes an inner portion located in an opening of a passivation layer of the die.

13. The semiconductor package of claim 12, wherein the inner portion has a non-circular cross-section across its lateral dimension.

14. The semiconductor package of claim 1, wherein the UBM structure is indirectly coupled to the die and the packaging substrate.

15. The semiconductor package of claim 14, wherein the UBM structure is indirectly coupled to the packaging substrate through a connection with a solder and a trace.

16. The semiconductor package of claim 14, wherein the UBM structure is indirectly coupled to the die through a connection with a metal layer.

17. The semiconductor package of claim 1, wherein the semiconductor package is incorporated into at least one of a music player, a video player, an entertainment unit, a navigation device, a communications device, a mobile phone, a smartphone, a personal digital assistant, a fixed location terminal, a tablet computer, and/or a laptop computer.

18. A die comprising:
at least one metal layer; and
a set of under bump metallization (UBM) structures coupled to the metal layer, wherein each UBM structure has a non-circular cross-section along its respective lateral dimension, each UBM structure includes a first narrower portion and a second wider portion, the first narrower portion having a first width, the second wider portion having a second width that is greater than the first width, each UBM structure oriented towards a particular region of the die such that the first narrower portion of the UBM structure is closer than the second wider portion of the UBM structure to the particular region of the die, wherein the second wider portion is distal to the particular region of the die relative to a center of the non-circular cross-section.

19. The die of claim 18, wherein each UBM structure is oriented on the die such that the first narrower portion of the UBM structure is susceptible to compression stress, and the second wider portion of the UBM structure is susceptible to peeling stress.

20. The die of claim 18, wherein each UBM structure has a longitudinal axis that is oriented towards the particular region of the die.

21. The die of claim 20, wherein the longitudinal axis of each UBM structure is oriented towards the particular region of the die to prevent delamination of the die.

22. The die of claim 18, wherein at least one UBM structure is a dummy UBM structure that is unable to provide an electrical path between the die and the packaging substrate when the die is coupled to the packaging substrate.

23. The die of claim 18, wherein the particular region is a center of the die.

24. The die of claim 18, further comprising a set of second bump metallization (UBM) structures coupled to the packaging substrate and the die, wherein each second UBM structure has a non-circular cross-section along its respective lateral dimension, each second UBM structure includes a third narrower portion and a fourth wider portion, the third narrower portion having a third width, the fourth wider portion having a fourth width that is greater than the third width, each second UBM structure oriented towards the particular region of the die such that the third narrower portion of the UBM structure is farther than the fourth wider portion of the UBM structure to the particular region of the die.

25. The die of claim 18, wherein the UBM structure is indirectly coupled to the substrate.

26. The die of claim 18, wherein the non-circular cross-section of the UBM structure is a teardrop cross-section.

27. The die of claim 18, wherein the non-circular cross-section of the UBM structure has at least one corner.

28. The die of claim 18, wherein the die is incorporated into at least one of a music player, a video player, an entertainment unit, a navigation device, a communications device, a mobile phone, a smartphone, a personal digital assistant, a fixed location terminal, a tablet computer, and/or a laptop computer.

29. A semiconductor package comprising:
a packaging substrate;
a die; and
an interconnect means for protecting against mechanical and thermal stress, the interconnect means coupled to the packaging substrate and the die, wherein each interconnect means has a non-circular cross-section along its respective lateral dimension, each interconnect means includes a first narrower portion and a second wider portion, the first narrower portion having a first width, the second wider portion having a second width that is greater than the first width, each interconnect means oriented towards a particular region of the die such that the first narrower portion of the interconnect means is closer than the second wider portion of the interconnect means to the particular region of the die, wherein the second wider portion is distal to the particular region of the die relative to a center of the non-circular cross-section.

30. The semiconductor package of claim 29, wherein each interconnect means is oriented on the die such that the first narrower portion of the interconnect means is susceptible to compression stress, and the second wider portion of the interconnect means is susceptible to peeling stress, the second wider portion being on an opposite end of the first narrower portion of the interconnect means.

31. The semiconductor package of claim 29, wherein each interconnect means has a longitudinal axis that is oriented towards the particular region of the die.

32. The semiconductor package of claim 31, wherein the longitudinal axis of each interconnect means is oriented towards the particular region of the die to prevent delamination of the die.

33. The semiconductor package of claim 29, wherein the packaging substrate includes a set of traces, each trace coupled to a respective interconnect means.

34. The semiconductor package of claim 33, wherein each trace is oriented towards the particular region of the die.

35. The semiconductor package of claim 29, wherein at least one interconnect means is a dummy interconnect means that is unable to provide an electrical path between the die and the packaging substrate.

36. The semiconductor package of claim 29, wherein the non-circular cross-section of the interconnect means is a teardrop cross-section.

37. The semiconductor package of claim 29, wherein the non-circular cross-section of the interconnect means has at least one corner.

38. The semiconductor package of claim 29, wherein at least one interconnect means includes an inner portion located in an opening of a passivation layer of the die.

39. The semiconductor package of claim 38, wherein the inner portion has a non-circular cross-section across its lateral dimension.

40. The semiconductor package of claim 29, wherein the semiconductor package is incorporated into at least one of a music player, a video player, an entertainment unit, a navigation device, a communications device, a mobile phone, a smartphone, a personal digital assistant, a fixed location terminal, a tablet computer, and/or a laptop computer.

41. A die comprising:
at least one metal layer; and
an interconnect means for protecting against mechanical and thermal stress, the interconnect means coupled to the metal layer, wherein each interconnect means has a non-circular cross-section along its respective lateral dimension, each interconnect means includes a first narrower portion and a second wider portion, the first narrower portion having a first width, the second wider portion having a second width that is greater than the first width, each interconnect means oriented towards a particular region of the die such that the first narrower portion of the interconnect means is closer than the second wider portion of the interconnect means to the particular region of the die, wherein the second wider portion is distal to the particular region of the die relative to a center of the non-circular cross-section.

42. The die of claim 41, wherein each interconnect means is oriented on the die such that the first narrower portion of the interconnect means is susceptible to compression stress, and the second wider portion of the interconnect means is susceptible to peeling stress, the second wider portion being on an opposite end of the first narrower portion of the interconnect means.

43. The die of claim 41, wherein each interconnect means has a longitudinal axis that is oriented towards the particular region of the die.

44. The die of claim 43, wherein the longitudinal axis of each interconnect means is oriented towards the particular region of the die to prevent delamination of the die.

45. The die of claim 41, wherein at least one interconnect means is a dummy interconnect means that is unable to provide an electrical path between the die and a packaging substrate when the die is coupled to the packaging substrate.

46. The die of claim 41, wherein the non-circular cross-section of the interconnect means is a teardrop cross-section.

47. The die of claim 41, wherein the non-circular cross-section of the interconnect means has at least one corner.

48. The die of claim 41, wherein the die is incorporated into at least one of a music player, a video player, an entertainment unit, a navigation device, a communications device, a mobile phone, a smartphone, a personal digital assistant, a fixed location terminal, a tablet computer, and/or a laptop computer.

49. A method for manufacturing an integrated circuit (IC), comprising:
providing a die having a plurality of metal layers and a plurality of dielectric layers; and
providing a set of under bump metallization (UBM) structures on the die, wherein the providing each UBM structure comprises:
forming the UBM structure to include a non-circular cross-section along its respective lateral dimension, a first narrower portion and a second wider portion, the first narrower portion having a first width, the second wider portion having a second width that is greater than the first width; and
positioning the UBM structure to be oriented towards a particular region of the die such that the first narrower portion of the UBM structure is closer than the second wider portion of the UBM structure to the particular region of the die, wherein the second wider portion is distal to the particular region of the die relative to a center of the non-circular cross-section.

50. The method of claim 49, wherein each UBM structure is oriented on the die such that the first narrower portion of the UBM structure is susceptible to compression stress, and the second wider portion of the UBM structure is susceptible to peeling stress, the second wider portion being on an opposite end of the first narrower portion of the UBM structure.

51. The method of claim 49, wherein each UBM structure has a longitudinal axis that is oriented towards the particular region of the die.

52. The method of claim 49, wherein at least one UBM structure is a dummy UBM structure that is unable to provide an electrical path between the die and a packaging substrate when the die is coupled to the packaging substrate.

53. The method of claim 49, wherein providing the set of UBM structure further comprises:
forming a set of second bump metallization (UBM) structures on the die, wherein each second UBM structure has a non-circular cross-section along its respective lateral dimension, each second UBM structure includes a third narrower portion and a fourth wider portion, the third narrower portion having a third width, the fourth wider portion having a fourth width that is greater than the third width; and positioning each second UBM structure to be oriented towards the particular region of the die such that the third narrower portion of the UBM structure is farther than the fourth wider portion of the UBM structure to the particular region of the die.

54. The method of claim 49, wherein the non-circular cross-section of the UBM structure is a teardrop cross-section.

55. The method of claim 49, wherein the non-circular cross-section of the UBM structure has at least one corner.

56. The method of claim 49, further comprising:
providing a set of traces for a packaging substrate; and
bonding the die to the packaging substrate by coupling at least some of the UBM structures of the die to the traces of the packaging substrate.

57. The method of claim 56, wherein the set of traces are aligned towards the particular region of the die, when the die is bonded to the packaging substrate.

58. The method of claim 49, wherein the die is incorporated into at least one of a music player, a video player, an entertainment unit, a navigation device, a communications device, a mobile phone, a smartphone, a personal digital assistant, a fixed location terminal, a tablet computer, and/or a laptop computer.

\* \* \* \* \*